US012784696B2

(12) United States Patent
Park et al.

(10) Patent No.: US 12,784,696 B2
(45) Date of Patent: Nov. 3, 2026

(54) DATA DRIVER HAVING DIFFERENT TRANSISTOR AREAS, DISPLAY DEVICE INCLUDING THE SAME, AND ELECTRONIC DEVICE INCLUDING THE SAME

(71) Applicant: Samsung Display Co., LTD., Yongin-si (KR)

(72) Inventors: No Kyung Park, Yongin-si (KR); Jun Soo Ko, Yongin-si (KR); Mun Gyu Kim, Yongin-si (KR); Sang Yong No, Yongin-si (KR); Gi Chang Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 19/097,370

(22) Filed: Apr. 1, 2025

(65) Prior Publication Data

US 2025/0391381 A1 Dec. 25, 2025

(30) Foreign Application Priority Data

Jun. 19, 2024 (KR) ........................ 10-2024-0079321
Sep. 3, 2024 (KR) ........................ 10-2024-0119466

(51) Int. Cl.

| | |
|---|---|
| ***G09G 3/3291*** | (2016.01) |
| ***G09G 3/00*** | (2006.01) |
| *H10K 59/122* | (2023.01) |
| *H10K 59/131* | (2023.01) |
| *H10K 59/38* | (2023.01) |
| *H10K 59/80* | (2023.01) |

(52) U.S. Cl.

CPC ........... *G09G 3/3291* (2013.01); *G09G 3/002* (2013.01); *G09G 2310/0289* (2013.01); *G09G 2310/0294* (2013.01); *G09G 2320/0673* (2013.01); *G09G 2330/028* (2013.01); *H10K 59/122* (2023.02); *H10K 59/131* (2023.02); *H10K 59/38* (2023.02); *H10K 59/873* (2023.02); *H10K 59/879* (2023.02)

(58) Field of Classification Search

CPC .................................................... G09G 3/3291
USPC ............................................................ 345/55
See application file for complete search history.

(56) References Cited

U.S. PATENT DOCUMENTS 9,929,741 B1 * 3/2018 Hsia ...................... H03M 1/742
2015/0325214 A1 * 11/2015 Ryu ..................... G09G 3/3688 345/99
2021/0335277 A1 * 10/2021 Hwang ................ G09G 3/3291
(Continued)

FOREIGN PATENT DOCUMENTS

KR 10-0360298 11/2002
KR 10-2023-0038345 3/2023

*Primary Examiner* — Long D Pham
(74) *Attorney, Agent, or Firm* — Womble Bond Dickinson (US) LLP

(57) ABSTRACT

A data driver includes a first latch that provides a first color grayscale in a first voltage range; a first level shifter that converts the first color grayscale in the first voltage range into a first color grayscale in a second voltage range greater than the first voltage range; a first decoder that generates a first gate control signal in the second voltage range based on the first color grayscale in the second voltage range; and a first digital-to-analog converter that provides a first gamma voltage of the first color grayscale based on the first gate control signal in the second voltage range.

18 Claims, 19 Drawing Sheets

(56) References Cited

U.S. PATENT DOCUMENTS

| | | | | |
|---|---|---|---|---|
| 2023/0078957 | A1 | 3/2023 | Park et al. | |
| 2024/0169881 | A1* | 5/2024 | Lee | G09G 3/2092 |

* cited by examiner

DATA DRIVER HAVING DIFFERENT TRANSISTOR AREAS, DISPLAY DEVICE INCLUDING THE SAME, AND ELECTRONIC DEVICE INCLUDING THE SAME

CROSS-REFERENCE TO RELATED APPLICATIONS

This application claims priority to and benefits of Korean Patent Application No. 10-2024-0079321 filed on Jun. 19, 2024 in the Korean Intellectual Property Office, and Korean Patent Application No. 10-2024-0119466 filed on Sep. 3, 2024 in the Korean Intellectual Property Office under 35 U.S.C. § 119, the entire contents of which are incorporated herein by reference.

BACKGROUND

1. Technical Field

The disclosure relates to a data driver, a display device, and an electronic device including the same.

2. Description of the Related Art

The importance of display devices as communication media, has been emphasized because of the increasing developments of information technology. Also, users of display devices such as a liquid crystal display device, an organic light emitting display device, and the like have been increasing and becoming more popular.

The display device displays an image by using pixels. The pixels can emit light based on gamma voltages of the grayscale of the image. As pixel resolution increases, the physical space available for wiring and components for gamma voltage generation and distribution may become inadequate.

It is to be understood that this background of the technology section is, in part, intended to provide useful background for understanding the technology. However, this background of the technology section may also include ideas, concepts, or recognitions that were not part of what was appreciated by those skilled in the pertinent art prior to a corresponding effective filing date of the subject matter disclosed herein.

SUMMARY

Embodiments provide a data driver capable of minimizing wire density.

Embodiments also provide a display device including the data driver.

Embodiments also provide an electronic device including the display device.

However, embodiments of the disclosure are not limited to those set forth herein. The above and other embodiments will become more apparent to one of ordinary skill in the art to which the disclosure pertains by referencing the detailed description of the disclosure given below.

An embodiment of the disclosure provides a data driver including: a first latch that provides a first color grayscale in a first voltage range; a first level shifter that converts the first color grayscale in the first voltage range into a first color grayscale in a second voltage range greater than the first voltage range; a first decoder that generates a first gate control signal in the second voltage range based on the first color grayscale in the second voltage range; and a first digital-to-analog converter that provides a first gamma voltage of the first color grayscale based on the first gate control signal in the second voltage range.

An area of each of first transistors of the first latch may be smaller than an area of each of second transistors of the first decoder, the first level shifter, and the first digital-to-analog converter.

The first decoder may receive the first color grayscale through N wires, and may output the first gate control signal through M wires, wherein N is an integer greater than 0, and M is an integer greater than N.

The data driver may further include a second latch that provides a second color grayscale in the first voltage range; a second level shifter that converts the second color grayscale in the first voltage range into the second color grayscale in the second voltage range; a second decoder that generates a second gate control signal in the second voltage range based on the second color grayscale in the second voltage range; and a second digital-to-analog converter that provides a second gamma voltage of the second color grayscale based on the second gate control signal in the second voltage range.

An area of each of first transistors of the second latch may be smaller than an area of each of second transistors of the second decoder, the second level shifter, and the second digital-to-analog converter.

The second decoder may receive the second color grayscale through N wires, and may output the second gate control signal through M wires, wherein N is an integer greater than 0, and M is an integer greater than N.

The second level shifter, the second decoder, and the second digital-to-analog converter may be disposed between the first latch and the first level shifter.

The data driver may further include a third latch that provides a third color grayscale in the first voltage range; a third level shifter that converts the third color grayscale in the first voltage range into the third color grayscale in the second voltage range; a third decoder that generates a third gate control signal in the second voltage range based on the third color grayscale in the second voltage range; and a third digital-to-analog converter that provides a third gamma voltage of the third color grayscale based on the third gate control signal in the second voltage range.

An area of each of first transistors of the third latch may be smaller than an area of each of second transistors of the third decoder, the third level shifter, and the third digital-to-analog converter.

The third decoder may receive the third color grayscale through N wires, and may output the third gate control signal through M wires, wherein N is an integer greater than 0, and M is an integer greater than N.

An embodiment of the disclosure provides a display device including: a first sub-pixel emitting light in a first color; a second sub-pixel emitting light in a second color; a third sub-pixel emitting light in a third color; and a data driver that supplies a first gamma voltage to the first sub-pixel based on a first color grayscale, supplies a second gamma voltage to the second sub-pixel based on a second color grayscale, and supplies a third gamma voltage to the third sub-pixel based on a third color grayscale, wherein the data driver includes a first latch that provides the first color grayscale in a first voltage range; a first level shifter that converts the first color grayscale in the first voltage range into a first color grayscale in a second voltage range greater than the first voltage range; a first decoder that generates a first gate control signal in the second voltage range based on the first color grayscale in the second voltage range; and a first digital-to-analog converter that provides the first gamma voltage of the first color grayscale based on the first gate control signal in the second voltage range.

An area of each of first transistors of the first latch may be smaller than an area of each of second transistors of the first decoder, the first level shifter, and the first digital-to-analog converter.

The first decoder may receive the first color grayscale through N wires, and may output the first gate control signal through M wires, wherein N is an integer greater than 0, and M is an integer greater than N.

The data driver may further include a second latch that provides the second color grayscale in the first voltage range; a second level shifter that converts the second color grayscale in the first voltage range into the second color grayscale in the second voltage range; a second decoder that generates a second gate control signal in the second voltage range based on the second color grayscale in the second voltage range; and a second digital-to-analog converter that provides the second gamma voltage of the second color grayscale based on the second gate control signal in the second voltage range.

An area of each of first transistors of the second latch may be smaller than an area of each of second transistors of the second decoder, the second level shifter, and the second digital-to-analog converter.

The second decoder may receive the second color grayscale through N wires, and may output the second gate control signal through M wires, wherein N is an integer greater than 0, and M is an integer greater than N.

The second level shifter, the second decoder, and the second digital-to-analog converter may be disposed between the first latch and the first level shifter.

The data driver may further include a third latch that provides the third color grayscale in the first voltage range; a third level shifter that converts the third color grayscale in the first voltage range into the third color grayscale in the second voltage range; a third decoder that generates a third gate control signal in the second voltage range based on the third color grayscale in the second voltage range; and a third digital-to-analog converter that provides the third gamma voltage of the third color grayscale based on the third gate control signal in the second voltage range.

An area of each of first transistors of the third latch may be smaller than an area of each of second transistors of the third decoder, the third level shifter, and the third digital-to-analog converter.

An embodiment of the disclosure provides an electronic device including: a processor that provides image data; and a display device that displays an image based on the image data. The display device includes a first sub-pixel emitting light in a first color; a second sub-pixel emitting light in a second color; a third sub-pixel emitting light in a third color; and a data driver that supplies a first gamma voltage to the first sub-pixel based on a first color grayscale, supplies a second gamma voltage to the second sub-pixel based on a second color grayscale, and supplies a third gamma voltage to the third sub-pixel based on a third color grayscale. The data driver includes a first latch that provides the first color grayscale in a first voltage range; a first level shifter that converts the first color grayscale in the first voltage range into the first color grayscale in a second voltage range greater than the first voltage range; a first decoder that generates a first gate control signal in the second voltage range based on the first color grayscale in the second voltage range; and a first digital-to-analog converter that provides the first gamma voltage of the first color grayscale based on the first gate control signal in the second voltage range.

An area of each of first transistors of the first latch may be smaller than an area of each of second transistors of the first decoder, the first level shifter, and the first digital-to-analog converter.

The first decoder may receive the first color grayscale through N wires, and output the first gate control signal through M wires, N may be an integer greater than 0, and M may be an integer greater than N.

The electronic device may further includes: a second latch that provides a second color grayscale in the first voltage range; a second level shifter that converts the second color grayscale in the first voltage range into the second color grayscale in the second voltage range; a second decoder that generates a second gate control signal in the second voltage range based on the second color grayscale in the second voltage range; and a second digital-to-analog converter that provides a second gamma voltage of the second color grayscale based on the second gate control signal in the second voltage range.

An area of each of first transistors of the second latch may be smaller than an area of each of second transistors of the second decoder, the second level shifter, and the second digital-to-analog converter.

The electronic device may be at least one of a portable computer, a mobile phone, a smart phone, a tablet personal computer (PC), a smart watch, a watch phone, a portable multimedia player (PMP), a navigation system, an ultra mobile personal computer (UMPC), a head-mounted display device (HMD), a virtual reality (VR) device, a mixed reality (MR) device, and an augmented reality (AR) device.

The data driver and the display device including the same according to the disclosure may minimize wire density.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION OF THE EMBODIMENTS

Figure 1:
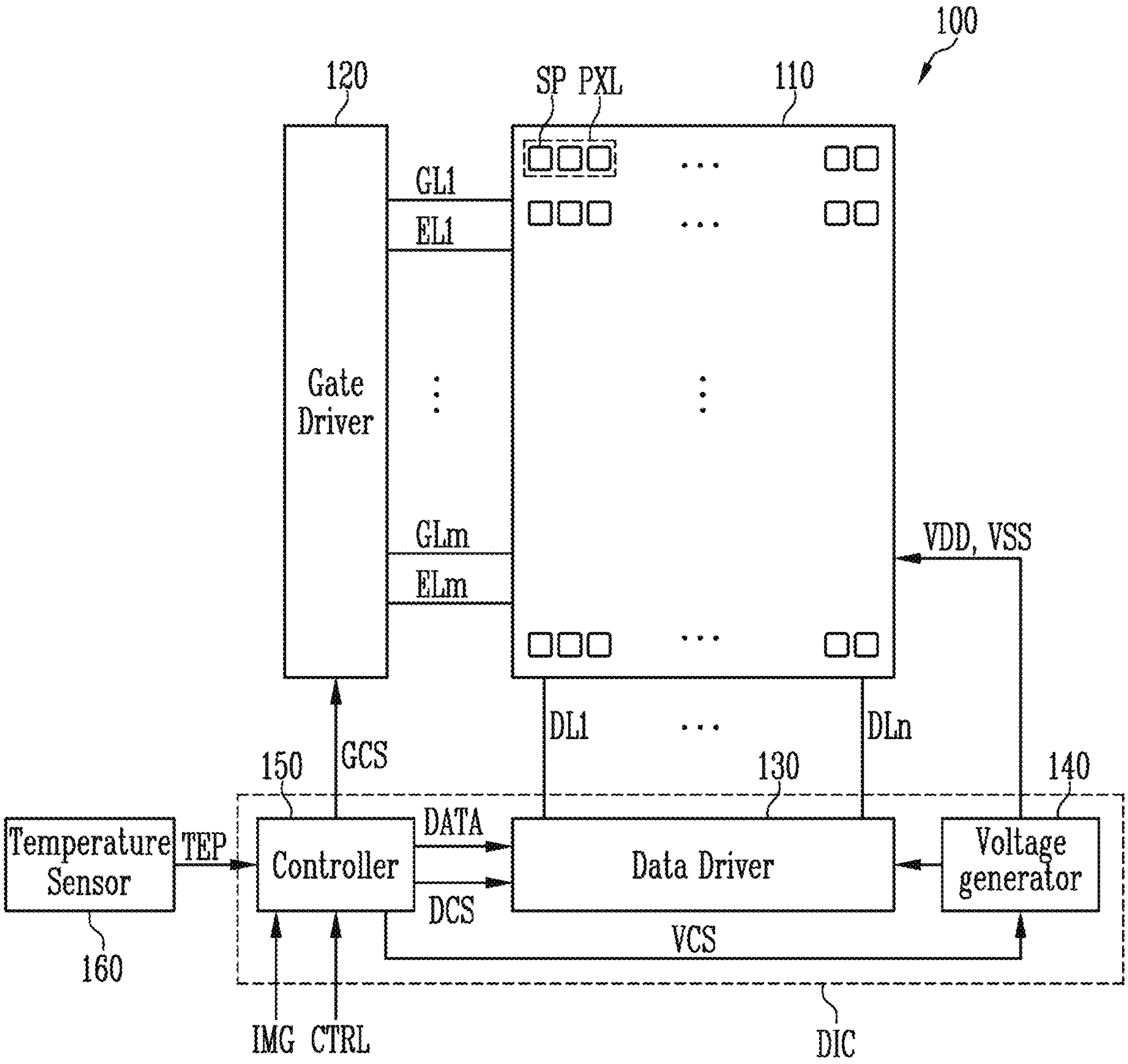
FIG. 1 illustrates a schematic block diagram of a display device according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the scope of the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the axis of the first direction DR1, the axis of the second direction DR2, and the axis of the third direction DR3 are not limited to three axes of a rectangular coordinate system, such as the X, Y, and Z-axes, and may be interpreted in a broader sense. For example, the axis of the first direction DR1, the axis of the second direction DR2, and the axis of the third direction DR3 may be perpendicular to one another, or may represent different directions that are not perpendicular to one another. For the purposes of this disclosure, "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shape of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the disclosure. Further, the blocks, units, and/or modules of some embodiments may be physically combined into more complex blocks, units, and/or modules without departing from the scope of the disclosure.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within 30%, 20%, 10%, 5% of the stated value.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

FIG. 1 illustrates a schematic block diagram of a display device according to an embodiment.

Referring to FIG. 1, the display device 100 may include a display panel 110, a gate driver 120, a data driver 130, a voltage generator 140, and a controller 150.

The display panel 110 may include sub-pixels SP. The sub-pixels SP may be electrically connected to the gate driver 120 through first to m-th gate lines GL1 to GLm. The sub-pixels SP may be electrically connected to the data driver 130 through first to n-th data lines DL1 to DLn.

Each of the sub-pixels SP may include at least one light emitting element generating light. Accordingly, the sub-pixels SP may respectively generate light of a color (e.g., a specific or selectable color), such as red, green, blue, cyan, magenta, yellow, or the like. For example, each sub-pixel SP may emit light (e.g., the light of the color such as red, green blue, cyan, magenta, yellow, or the like) independently of a separate light source. Two or more of the sub-pixels SP may form (e.g., configure or be included in) a pixel PXL. For example, as shown in FIG. 1, three sub-pixels may form (e.g., configure or be included in) a pixel PXL.

The gate driver 120 may be electrically connected to the sub-pixels SP arranged in a row direction through the first to m-th gate lines GL1 to GLm. The gate driver 120 may output gate signals to the first to m-th gate lines GL1 to GLm in response to a gate control signal GCS. In embodiments, the gate control signal GCS may include a start signal indicating the start of each frame, a horizontal synchronization signal for outputting gate signals in synchronization with the timing at which data signals are applied, and the like.

In the embodiments, first to m-th light emitting control lines EL1 to ELm electrically connected to the sub-pixels SP in a row direction may be further provided in the display device 100. The gate driver 120 may include alight emitting control driver controlling the first to m-th light emitting control lines EL1 to ELm, and the light emitting control driver may operate under (e.g., based on) the control of the controller 150.

The gate driver 120 may be disposed on a side of the display panel 110. However, embodiments are not limited thereto. For example, the gate driver 120 may be divided into two or more physically and/or logically separated drivers, and the drivers may be disposed on the side of the display panel 110 and another side of the display panel 110 opposite to the side. As described above, the gate driver 120 may be disposed around (or adjacent to) the display panel 110 in various forms according to the embodiments.

The data driver 130 may be electrically connected to the sub-pixels SP arranged in a column direction through the first to n-th data lines DL1 to DLn. The data driver 130 may receive image data DATA and a data control signal DCS from the controller 150. The data driver 130 may operate (e.g., operate the display panel 110) in response to the data control signal DCS. In embodiments, the data control signal DCS may include a source start pulse, a source shift clock, a source output enable signal, and the like.

The data driver 130 may use voltages from the voltage generator 140 and apply data signals having grayscale voltages (or gamma voltages) of (e.g., corresponding to) the image data DATA to the first to n-th data lines DL1 to DLn. In case that agate signal is applied to each of the first to m-th gate lines GL1 to GLm, data signals of (e.g., corresponding to) the image data DATA may be applied to the data lines DL1 to DLm. Accordingly, the corresponding sub-pixels SP may generate light of (e.g., corresponding to) the data signals. Accordingly, an image may be displayed on the display panel 110.

In some embodiments, the gate driver 120 and the data driver 130 may include complementary metal-oxide semiconductor (CMOS) circuit elements.

The voltage generator 140 may operate (e.g., operate the display panel 110 and the data driver 130) in response to a voltage control signal VCS from the controller 150. The voltage generator 140 may generate voltages and provide the generated voltages to constituent elements of the display device 100. For example, the voltage generator 140 may generate voltages by receiving an input voltage from the outside of the display device 100, adjusting the received voltage, and regulating the adjusted voltage.

The voltage generator 140 may generate a first power voltage VDD and a second power voltage VSS, and the generated first and second power voltages VDD and VSS may be provided to the sub-pixels SP. The first power voltage VDD may have a relatively high voltage level, and the second power voltage VSS may have a voltage level lower than the first power voltage VDD. In other embodiments, the first power voltage VDD or the second power voltage VSS may be provided by an external device of the display device 100.

The voltage generator 140 may generate various voltages. For example, the voltage generator 140 may generate an initialization voltage applied to the sub-pixels SP. For example, during a sensing operation to sense electrical characteristics of transistors and/or light emitting elements of the sub-pixels SP, a reference voltage (e.g., a predetermined or selectable reference voltage) may be applied to the first to n-th data lines DL1 to DLn, and the voltage generator 140 may generate the reference voltage.

The controller 150 may control various operations of the display device 100. The controller 150 may receive input image data IMG and a control signal CTRL for controlling the display of the input image data IMG, from the outside. The controller 150 may provide the gate control signal GCS, the data control signal DCS, and the voltage control signal VCS in response to the control signal CTRL.

The controller 150 may convert the input image data IMG to be suitable for the display device 100 or the display panel 110 and output the image data DATA (e.g., output the image data DATA to the data driver 130). In embodiments, the controller 150 may output the image data DATA by aligning the input image data IMG to be suitable for the sub-pixels SP of a row.

Two or more components of the data driver 130, the voltage generator 140, and the controller 150 may be mounted on an integrated circuit. As shown in FIG. 1, the data driver 130, the voltage generator 140, and the controller 150 may be included in a driver integrated circuit DIC. The data driver 130, the voltage generator 140, and the controller 150 may be functionally separate components in the driver integrated circuit DIC. In other embodiments, at least one of the data driver 130, the voltage generator 140, and the controller 150 may be provided as (e.g., form) a component separated from the driver integrated circuit DIC.

The display device 100 may include at least one temperature sensor 160. The temperature sensor 160 may sense a surrounding temperature and generate temperature data TEP representing the sensed temperature. In embodiments, the temperature sensor 160 may be adjacent to the display panel 110 and/or the driver integrated circuit DIC.

The controller 150 may control various operations of the display device 100 in response to the temperature data TEP. In embodiments, the controller 150 may adjust the luminance of an image outputted from the display panel 110 in response to the temperature data TEP. For example, the controller 150 may control the data signals and the first and second power voltages VDD and VSS by controlling components such as the data driver 130 and/or the voltage generator 140.

Figure 2:
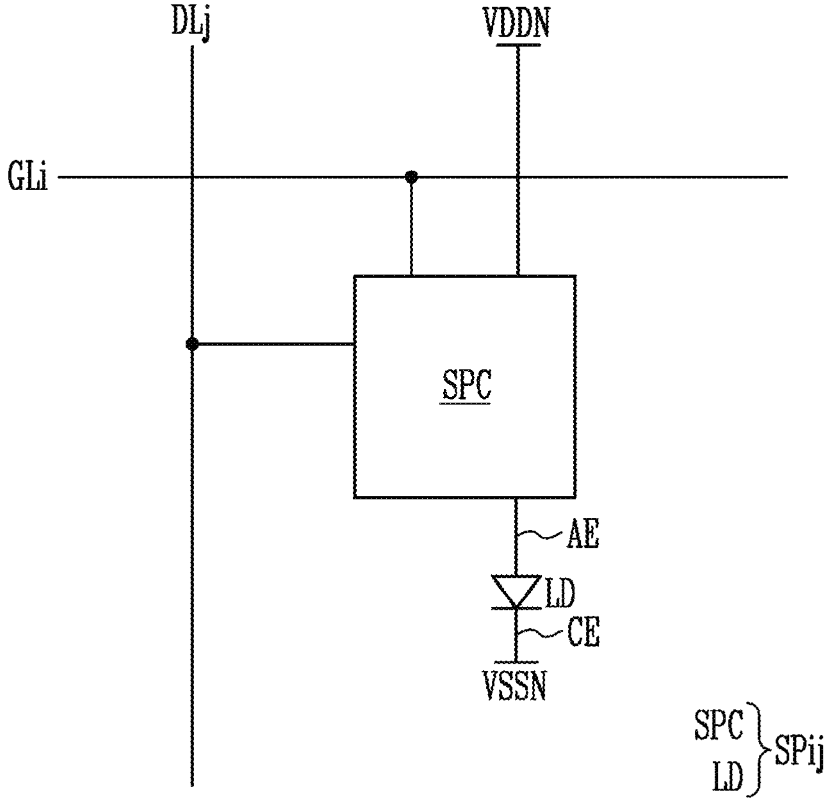
FIG. 2 illustrates a schematic block diagram of a sub-pixel.

FIG. 2 illustrates a schematic block diagram of one of sub-pixels of FIG. 1 according to an embodiment. In FIG. 2, among the sub-pixels SP of FIG. 1, a sub-pixel SPij disposed in an i-th row (i is an integer greater than or equal to 1 and less than or equal to m) and a j-th column (j is an integer greater than or equal to 1 and less than or equal to n) is illustrated as an example.

FIG. 2 illustrates a block diagram of a sub-pixel.

Referring to FIG. 2, among the sub-pixels SP (e.g., refer to FIG. 1), a sub-pixel SPij disposed in an i-th row (i is an integer greater than or equal to 1 and less than or equal to m) and a j-th column (j is an integer greater than or equal to 1 and less than or equal to n) is illustrated as an example. The sub-pixel SPij may include a sub-pixel circuit SPC and a light emitting element LD.

The light emitting element LD may be electrically connected between the first power voltage node VDDN and a second power voltage node VSSN. The first power voltage node VDDN may be a node that transmits the first power voltage VDD of FIG. 1, and the second power voltage node VSSN may be a node that transmits the second power voltage VSS of FIG. 1.

An anode electrode AE of the light emitting element LD may be electrically connected to the first power voltage node VDDN through the sub-pixel circuit SPC, and a cathode electrode CE of the light emitting element LD may be electrically connected to the second power voltage node VSSN. For example, the anode electrode AE of the light emitting element LD may be electrically connected to the first power voltage node VDDN through one or more transistors of (e.g., included in) the sub-pixel circuit SPC.

The sub-pixel circuit SPC may be electrically connected to an i-th gate line GLi of the first to m-th gate lines GL1 to GLm of FIG. 1 and a j-th data line DLj of the first to n-th data lines DL1 to DLn of FIG. 1. The sub-pixel circuit SPC may control the light emitting element LD according to signals received through these signal lines.

The sub-pixel circuit SPC may operate (e.g., operate the light emitting element LD) in response to a gate signal received through the i-th gate line GLi. The sub-pixel circuit SPC may receive a data signal through the j-th data line DLj. For example, the sub-pixel circuit SPC may respond to the gate signal and store a voltage of (e.g., corresponding to) the data signal. Based on the voltage stored in the sub-pixel circuit SPC, the light emitting element LD may generate light having a luminance of (e.g., corresponding to) the data signal.

Figure 3:
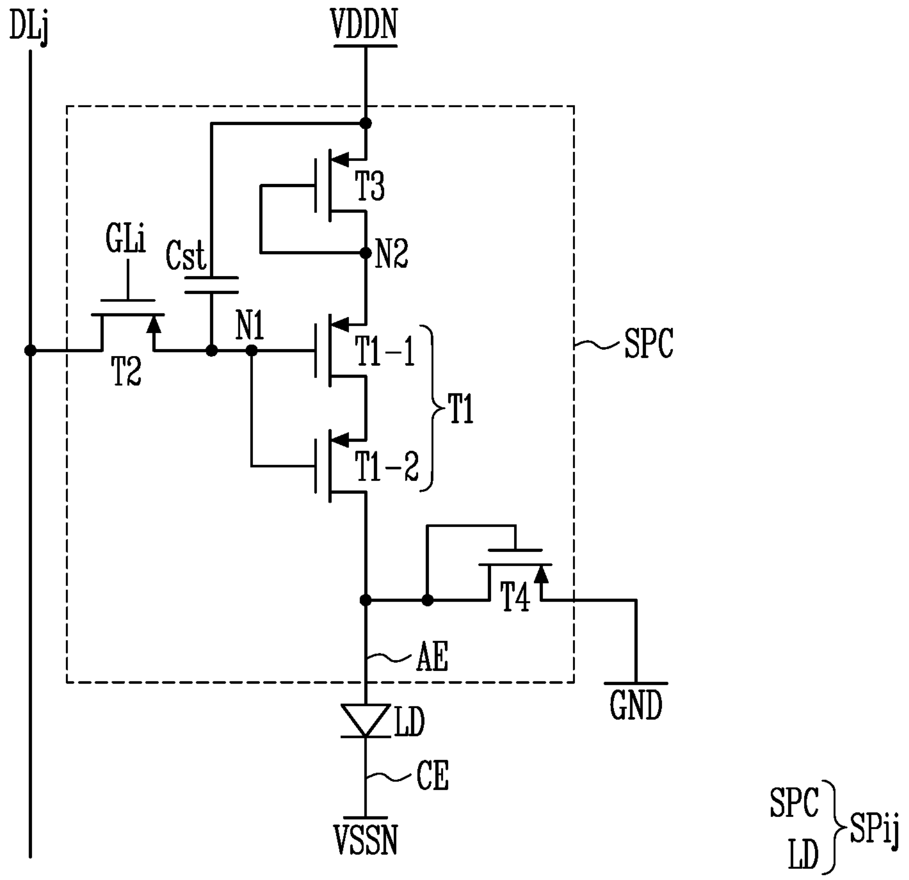
FIG. 3 is a schematic diagram of an equivalent circuit explaining a sub-pixel according to an embodiment.

FIG. 3 is a schematic diagram of an equivalent circuit explaining a sub-pixel according to an embodiment.

Referring to FIG. 3, the sub-pixel SPij may include a sub-pixel circuit SPC and a light emitting element LD. The sub-pixel circuit SPC may include first to fourth transistors T1 to T4 and a storage capacitor Cst.

In the first transistor T1, a gate electrode may be electrically connected to a first node N1, a first electrode may be electrically connected to a second node N2, and a second electrode may be electrically connected to the anode electrode AE of the light emitting element LD. The first transistor T1 may include sub-transistors T1-1 and T1-2 electrically connected in series. The first transistor T1 may be a driving transistor.

In the second transistor T2, a gate electrode may be electrically connected to the i-th gate line GLi, a first electrode may be electrically connected to the j-th data line DLj, and a second electrode may be electrically connected to the first node N1.

In the third transistor T3, a gate electrode may be electrically connected to the second node N2, a first electrode may be electrically connected to the first power voltage node VDDN, and a second electrode may be electrically connected to the second node N2.

In the fourth transistor T4, a gate electrode and a first electrode may be electrically connected to the anode electrode AE of the light emitting element LD, and a second electrode may receive a reference voltage GND. The reference voltage GND may be smaller than the first power voltage VDD. In the embodiment, the reference voltage GND may be the same as the second power voltage VSS (e.g., refer to FIG. 1). In another embodiment, the reference voltage GND may be different from the second power voltage VSS.

In the storage capacitor Cst, a first electrode may be electrically connected to the first power voltage node VDDN, and a second electrode may be electrically connected to the first node N1.

The light emitting element LD may include the anode electrode AE, the cathode electrode CE, and the light emitting structure. The light emitting structure of the light emitting element LD may be disposed between the anode electrode AE and the cathode electrode CE.

In case that a gate signal at a turn-on level (for example, a low level) is applied to the i-th gate line GLi, the second transistor T2 may be turned on. The data signal applied to the j-th data line DLj may be applied to the first node N1 through the second transistor T2. The storage capacitor Cst may maintain the voltage of the data signal. In response to the voltage of the data signal, the first transistor T1 may determine an amount of a driving current flowing from the first power voltage node VDDN to the second power voltage node VSSN. The light emitting element LD may emit light with luminance corresponding to (e.g., generated by) the amount of the driving current.

The third transistor T3 and the fourth transistor T4 may be diode-connected transistors, which may limit the direction of the current and the current may not flow in the reverse direction. In some embodiments, the third transistor T3 and the fourth transistor T4 may be removed from (or omitted in) the sub-pixel circuit SPC. In case that the third transistor T3 is removed (or omitted), the second node N2 may be electrically connected (e.g., directly connected) to the first power voltage node VDDN.

The first to fourth transistors T1 to T4 may be P-type transistors. Each of the first to fourth transistors T1 to T4 may be a metal oxide silicon field effect transistor (MOSFET). However, embodiments are not limited thereto. For example, at least one of the first to fourth transistors T1 to T4 may be replaced with an N-type transistor.

In embodiments, the transistors T1 to T4 may include an amorphous silicon semiconductor, a monocrystalline silicon semiconductor, a polycrystalline silicon semiconductor, an oxide semiconductor, or the like.

Figure 4:
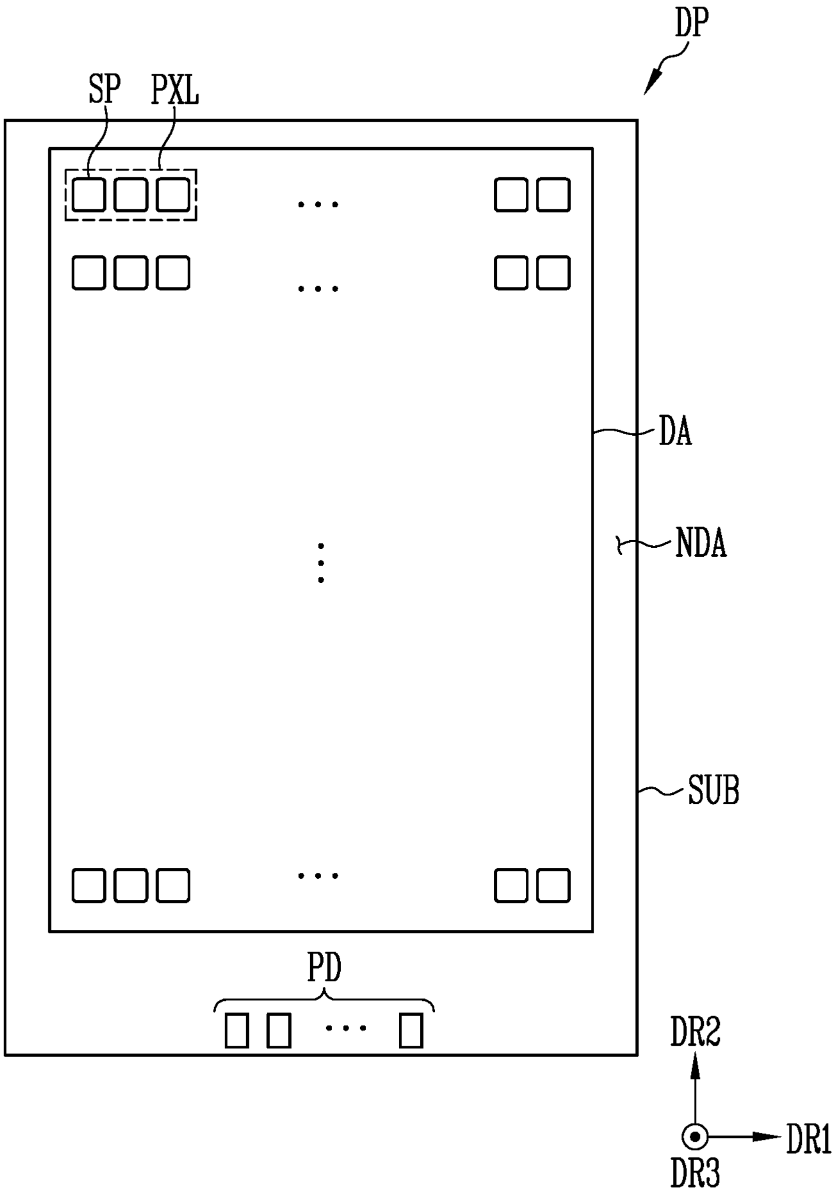
FIG. 4 illustrates a schematic plan view of a display panel of FIG. 1 according to an embodiment.

FIG. 4 illustrates a schematic plan view of a display panel of FIG. 1 according to an embodiment.

Referring to FIG. 4, a display panel DP may be the same or similar to the display panel 110 of FIG. 1. The display panel DP may include a display area DA and a non-display area NDA. The display panel DP may display an image through the display area DA. The non-display area NDA may be disposed around (or adjacent to) the display area DA.

The display panel DP may include a substrate SUB, sub-pixels SP, and pads PD.

In case that the display panel DP is used as a display screen for a head-mounted display (HMD), a virtual reality (VR) device, a mixed reality (MR) device, an augmented reality (AR) device, or the like, the display panel DP may be disposed (or positioned) adjacent to (e.g., very close to) the user's eyes. The sub-pixels SP with relatively high integration may be desired (e.g., may be required) in the display panel DP. To increase the integration of the sub-pixels SP, the substrate SUB may be provided as (e.g., include) a silicon substrate. The sub-pixels SP and/or the display panel DP may be formed on the substrate SUB, which is a silicon substrate. The display device 100 (e.g., refer to FIG. 1) including the display panel DP formed on the substrate SUB, which is a silicon substrate, may be referred to as an OLED on silicon (OLEDoS) display device.

The sub-pixels SP may be disposed in the display area DA on the substrate SUB. The sub-pixels SP may be arranged in a matrix format along a first direction DR1 and a second direction DR2 that intersects (or crosses) the first direction DR1. However, embodiments are not limited thereto. For example, the sub-pixels SP may be arranged in a zigzag form along the first direction DR1 and the second direction DR2. For example, the sub-pixels SP may be disposed in a PENTILE™ shape. The first direction DR1 may be a row direction, and the second direction DR2 may be a column direction.

Two or more of the sub-pixels SP may form (e.g., configure or be included in) a pixel PXL.

A constituent element to control the sub-pixels SP may be disposed in the non-display area NDA on the substrate SUB. For example, wires electrically connected to the sub-pixels SP, such as the first to m-th gate lines GL1 to GLm and the first to n-th data lines DL1 to DLn of FIG. 1, may be disposed in the non-display area NDA.

At least one of the gate driver 120, the data driver 130, the voltage generator 140, the controller 150, and the temperature sensor 160 in FIG. 1 may be integrated in the non-display area NDA of the display panel DP. In embodiments, the gate driver 120 of FIG. 1 may be mounted on the display panel DP, and may be disposed in the non-display area NDA. In other embodiments, the gate driver 120 may be implemented as (or include) an integrated circuit separated from the display panel DP. In embodiments, the temperature sensor 160 may be disposed in the non-display area NDA and detect the temperature of the display panel DP.

The pads PD may be disposed in the non-display area NDA on the substrate SUB. The pads PD may be electrically connected to the sub-pixels SP through wires. For example, the pads PD may be electrically connected to the sub-pixels SP through the first to n-th data lines DL1 to DLn.

The pads PD may interface (e.g., electrically connect) the display panel DP to other constituent elements of the display device 100 (e.g., refer to FIG. 1). In embodiments, voltages and signals required for operations of constituent elements of (e.g., included in) the display panel DP may be provided from the driver integrated circuit DIC of FIG. 1 through the pads PD. For example, the first to n-th data lines DL1 to DLn may be electrically connected to the driver integrated circuit DIC through the pads PD. For example, the first and second power voltages VDD and VSS may be received from the driver integrated circuit DIC through the pads PD. For example, in case that the gate driver 120 is mounted on the display panel DP, the gate control signal GCS (e.g., refer to FIG. 1) may be transmitted from the driver integrated circuit DIC to the gate driver 120 through the pads PD.

In embodiments, the circuit board may be electrically connected to the pads PD by using a conductive adhesive member such as an anisotropic conductive film. The circuit board may be a flexible printed circuit board (FPCB) or a flexible film including (e.g., made of) a flexible material. The driver integrated circuit DIC may be mounted on the circuit board and electrically connected to the pads PD.

In embodiments, the display area DA may have various shapes. The display area DA may have a closed-loop shape including sides of a straight line and/or a curved line. For example, the display area DA may have shapes such as a polygonal shape, a circular shape, a semicircular, an elliptical shape, or the like.

In embodiments, the display panel DP may have a flat display surface. In other embodiments, the display panel DP may have a display surface that is at least partially rounded. In embodiments, the display panel DP may be bendable, foldable, or rollable. The display panel DP and/or the substrate SUB may include materials with flexible properties.

Figure 5:
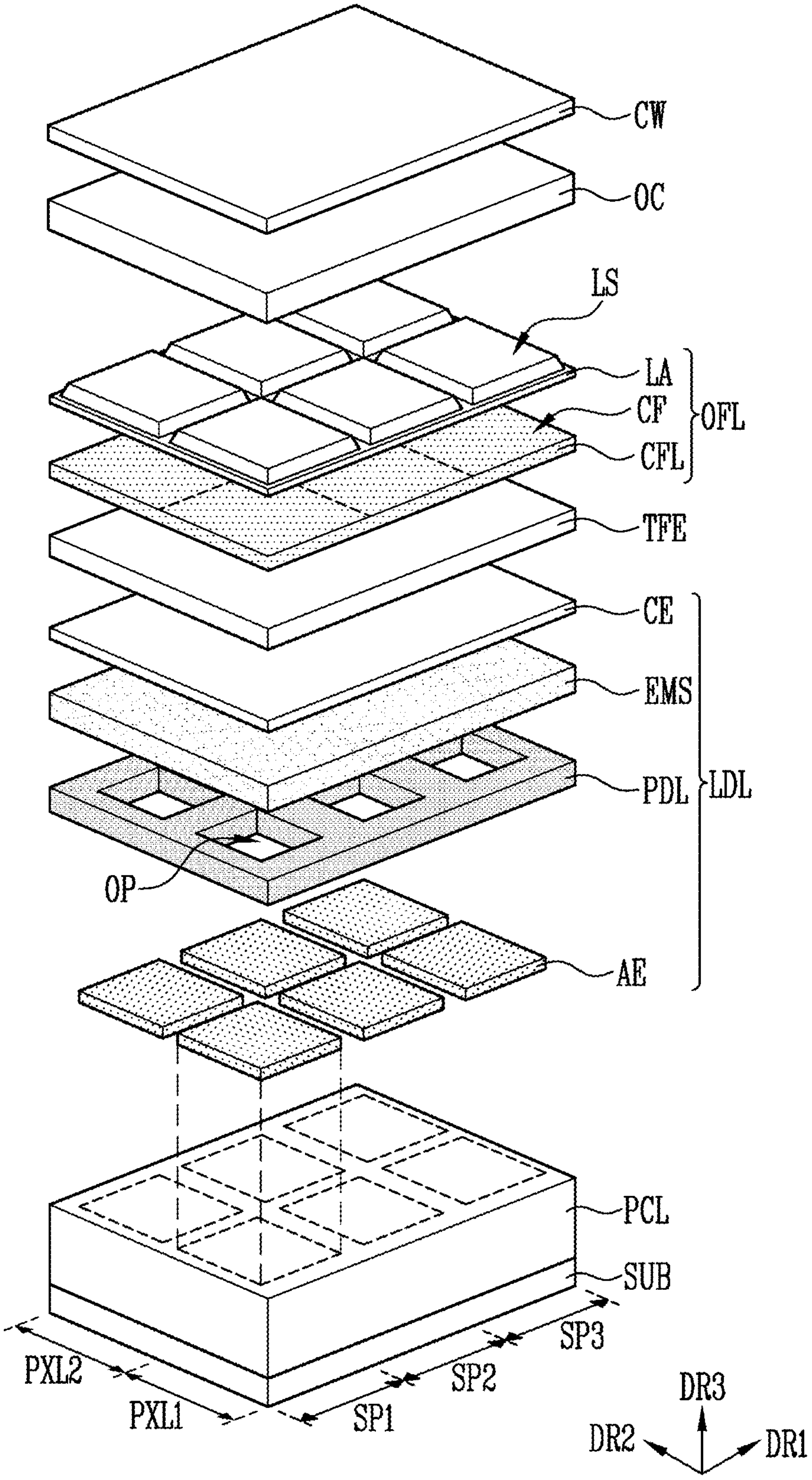
FIG. 5 illustrates a schematic exploded perspective view of a portion of the display panel of FIG. 4.

FIG. 5 illustrates a schematic exploded perspective view of a portion of a display panel of FIG. 4. In FIG. 5, for clear and concise description, a portion of the display panel DP corresponding to two pixels PXL1 and PXL2 among the pixels PXL of FIG. 4 is schematically shown. Portions of the display panel DP corresponding to the remaining pixels may be similarly configured.

Referring to FIGS. 4 and 5, each of the first and second pixels PXL1 and PXL2 may include first to third sub-pixels SP1, SP2, and SP3. However, embodiments are not limited thereto. For example, each of the first and second pixels PXL1 and PXL2 may include four sub-pixels, or two sub-pixels.

In FIG. 5, the first to third sub-pixels SP1, SP2, and SP3 may have quadrangular shapes and have the same sizes in the third direction DR3 intersecting (e.g., crossing) the first and second directions DR1 and DR2. However, embodiments are not limited thereto. The first to third sub-pixels SP1, SP2, and SP3 may be modified to have various shapes.

The display panel DP may include a substrate SUB, a pixel circuit layer PCL, a light emitting element layer LDL, an encapsulation layer TFE, an optical functional layer OFL, an overcoat layer OC, and a cover window CW.

In embodiments, the substrate SUB may include a silicon wafer substrate formed using a semiconductor process. The substrate SUB may include a semiconductor material suitable for forming circuit elements. For example, the semiconductor material of the substrate SUB may include at least one of silicon, germanium, and silicon-germanium. However, the disclosure is not limited thereto. The substrate SUB may include (or be provided from) at least one of a bulk wafer, an epitaxial layer, an epitaxial layer, a silicon on Insulator (SOI) layer, and a semiconductor on insulator (SeOI) layer. In other embodiments, the substrate SUB may include a glass substrate. In other embodiments, the substrate SUB may include a polyimide (PI) substrate.

The pixel circuit layer PCL may be disposed on the substrate SUB. The substrate SUB and/or the pixel circuit layer PCL may include insulating layers and conductive patterns disposed between the insulating layers. The conductive patterns of the pixel circuit layer PCL may form (e.g., function as) at least some of circuit elements, wires, and the like. The conductive patterns may include copper, but embodiments are not limited thereto.

The circuit elements may include the sub-pixel circuit SPC (e.g., refer to FIG. 2) for each of first to third sub-pixels SP1, SP2, and SP3. The sub-pixel circuit SPC may include transistors and one or more capacitors. Each transistor may include a semiconductor portion including a source region, a drain region, a channel region, and a gate electrode overlapping the semiconductor portion in a plan view. In embodiments, in case that the substrate SUB is provided as a silicon substrate, the semiconductor portion of the transistor may be included in the substrate SUB, and the gate electrode of the transistor may be included in the pixel circuit layer PCL as the conductive pattern of the pixel circuit layer PCL. In embodiments, in case that the substrate SUB is provided as a glass substrate or a PI substrate, the semiconductor portion and the gate electrode of the transistor may be included in the pixel circuit layer PCL. Each capacitor may include electrodes spaced apart from each other. For example, each capacitor may include electrodes spaced apart from each other in the third direction DR3, and disposed on a plane defined by the first and second directions DR1 and DR2. The electrodes of the capacitor may overlap each other in a plan view. For example, each capacitor may include electrodes spaced apart from each other in the third direction DR3 with an insulating layer between the electrodes.

The wires of the pixel circuit layer PCL may include signal lines electrically connected to each of the first to third sub-pixels SP1, SP2, and SP3. For example, the wires of the pixel circuit layer PCL may include gate lines, light emitting control lines, data lines, or the like. The wires may further include a wire electrically connected to the first power voltage node VDDN of FIG. 2. The wires may further include the wire electrically connected to the second power voltage node VSSN of FIG. 2.

The light emitting element layer LDL may include anode electrodes AE, a pixel defining layer PDL, a light emitting structure EMS, and a cathode electrode CE.

The anode electrodes AE may be disposed on the pixel circuit layer PCL. The anode electrodes AE may contact circuit elements of the pixel circuit layer PCL. The anode electrodes AE may include an opaque conductive material capable of reflecting light, but embodiments are not limited thereto.

The pixel defining layer PDL may be disposed on the anode electrodes AE. The pixel defining layer PDL may include openings OP each exposing a portion of each of the anode electrodes AE. Light emitting areas respectively corresponding to the first to third sub-pixels SP1 to SP3 may be defined by the openings OP of the pixel defining layer PDL. In other embodiments, light emitting areas respectively corresponding to the first to third sub-pixels SP1 to SP3 may be defined according to the anode electrodes AE. In an area adjacent to the boundary of neighboring (or adjacent) sub-pixels, the pixel defining layer PDL may include a separator causing a discontinuity to be formed in the light emitting structure EMS. For example, the separator may be disposed between adjacent ones of the first to third sub-pixels SP1 to SP3, and may form the discontinuity in the light emitting structure EMS. Light emitting areas respectively corresponding to the first to third sub-pixels SP1 to SP3 may be defined by the separators of the pixel defining layer PDL.

In embodiments, the pixel defining layer PDL may include an inorganic material. The pixel defining layer PDL may include stacked inorganic layers. For example, the pixel defining layer PDL may include at least one of a silicon oxide ($SiO_x$) and a silicon nitride ($SiN_x$). In other embodiments, the pixel defining layer PDL may include an organic material. However, the material of the pixel defining layer PDL is not limited thereto.

The light emitting structure EMS may be disposed on the anode electrodes AE exposed by the openings OP of the pixel defining layer PDL. The light emitting structure EMS may include a light emitting layer generating light, an electron transport layer transporting electrons, and a hole transport layer transporting holes.

In embodiments, the light emitting structure EMS may fill the openings OP of the pixel defining layer PDL, and may be disposed on (e.g., disposed entirely on or cover) an upper portion of the pixel defining layer PDL. For example, the light emitting structure EMS may extend across the first to third sub-pixels SP1 to SP3. At least some of the functional layers in the light emitting structure EMS may be disconnected or bent at the boundaries between the first to third sub-pixels SP1 to SP3. However, embodiments are not limited thereto. For example, portions of the light emitting structure EMS corresponding to the first to third sub-pixels SP1 to SP3 may be separated from each other, and each of the first to third sub-pixels SP1 to SP3 may be disposed in the openings OP of the pixel defining layer PDL.

The cathode electrode CE may be disposed on the light emitting structure EMS. The cathode electrode CE may extend across the first to third sub-pixels SP1 to SP3. As such, the cathode electrode CE may be provided as (e.g., form) a common electrode for the first to third sub-pixels SP1 to SP3.

The cathode electrode CE may be a thin metal layer with a thickness sufficient to transmit light emitted from the light emitting structure EMS. The cathode electrode CE may include (e.g., be made of) a metallic material or a transparent conductive material to have a relatively thin thickness. In the embodiments, the cathode electrode CE may include at least one of various transparent conductive materials including an indium tin oxide, an indium zinc oxide, an indium tin zinc oxide, an aluminum zinc oxide, a gallium zinc oxide, a zinc tin oxide, and a gallium tin oxide. In other embodiments, the cathode electrode CE may include at least one of silver (Ag), magnesium (Mg), a mixture thereof, and an alloy thereof. However, the material of the cathode electrode CE is not limited thereto.

One of the anode electrodes AE, the portion of the light emitting structure EMS overlapping the anode electrode AE in a plan view, and the portion of the cathode electrode CE overlapping the anode electrode AE in a plan view may form (e.g., configure or be included in) a light emitting element LD (e.g., refer to FIG. 2). For example, each of the light emitting elements LD of the first to third sub-pixels SP1 to SP3 may include an anode electrode AE, a portion of the light emitting structure EMS overlapping the anode electrode AE in a plan view, and a portion of the cathode electrode CE overlapping the anode electrode AE in a plan view. In each of the first to third sub-pixels SP1 to SP3, holes injected from the anode electrode AE and electrons injected from the cathode electrode CE may be transported into the light emitting layer of the light emitting structure EMS and form excitons. In case that the excitons transition from the excited state to the ground state, light may be generated. The luminance of light may be determined depending on the amount of current flowing through the light emitting layer of each of the light emitting elements LD. Depending on the configuration of the light emitting layer, the wavelength range of the generated light may be determined.

The encapsulation layer TFE may be disposed on the cathode electrode CE. The encapsulation layer TFE may cover (or overlap in a plan view) the light emitting element layer LDL and/or the pixel circuit layer PCL. The encapsulation layer TFE may prevent oxygen and/or moisture from penetrating into the light emitting element layer LDL. In embodiments, the encapsulation layer TFE may include a structure in which one or more inorganic films and one or more organic films are alternately stacked each other. For example, the inorganic film of the encapsulation layer TFE may include at least one of a silicon nitride, a silicon oxide, and a silicon oxynitride ($SiO_xN_y$). For example, the organic film of the encapsulation layer TFE may include an organic insulating material including at least one of an acrylic resin, an epoxy resin, a phenol resin, a polyamide resin, a polyimide resin, an unsaturated polyesters resin, a polyphenylenethers resin, a polyphenylenesulfides resin, and a benzocyclobutene. However, the materials of the organic film and the inorganic film of the encapsulation layer TFE are not limited thereto.

The encapsulation layer TFE may further include a thin film containing an aluminum oxide ($AlO_x$), and the encapsulation efficiency of the encapsulation layer TFE may be improved. At least one thin film containing an aluminum oxide may be disposed on the upper surface of the encapsulation layer TFE facing the optical functional layer OFL and/or the lower surface of the encapsulation layer TFE facing the light emitting element layer LDL.

The thin film containing the aluminum oxide may be formed through atomic layer deposition (ALD). However, embodiments are not limited thereto. The encapsulation layer TFE may further include a thin film including (e.g., made of) at least one of various materials suitable for improving the encapsulation efficiency.

The optical functional layer OFL may be disposed on the encapsulation layer TFE. The optical function layer OFL may include a color filter layer CFL and a lens array LA.

The color filter layer CFL may be disposed between the encapsulation layer TFE and the lens array LA. The color filter layer CFL may selectively output light in a wavelength range of color corresponding to each sub-pixel by filtering light emitted from the light emitting structure EMS. The color filter layer CFL may include color filters CF respectively corresponding to the first to third sub-pixels SP1 to SP3, and each of the color filters CF may pass (or transmit) light in a wavelength range corresponding to each of the sub-pixels SP1 to SP3. For example, a color filter CF of (e.g., corresponding to) the first sub-pixel SP1 may pass (or transmit) red light, a color filter CF of (e.g., corresponding to) the second sub-pixel SP2 may pass (or transmit) green light, and a color filter CF of (e.g., corresponding to) the third sub-pixel SP3 may pass (or transmit) blue light. At least some of the color filters CF may be omitted according to light emitted from the light emitting structure EMS of each of the sub-pixels SP1 to SP3.

The lens array LA may be disposed on the color filter layer CFL. The lens array LA may include lenses LS respectively corresponding to the first to third sub-pixels SP1 to SP3. Each of the lenses LS may improve light output efficiency by outputting light emitted from the light emitting structure EMS in an intended path. For example, the lenses LS may guide the light emitted from the light emitting structure EMS in the intended path, and improve the light output efficiency. The lens array LA may have a relatively high refractive index. For example, the lens array LA may have a higher refractive index than the overcoat layer OC. In embodiments, the lenses LS may include an organic material. In embodiments, the lenses LS may include an acrylic material. However, the material of the lenses LS is not limited thereto.

In embodiments, compared to the openings OP of the pixel defining layer PDL, at least some of the color filters CF of the color filter layer CFL and at least some of the lenses LS of the lens array LA may be shifted in a direction parallel to a plane defined by the first and second directions DR1 and DR2. For example, in the central area of the display area DA, the center of each of the color filters CF and the center of the lens LS may be aligned (or overlap) the center of each of the openings OP of the corresponding pixel defining layer PDL in the third direction DR3. For example, in the central area of the display area DA, the openings OP of the pixel defining layer PDL may completely overlap the corresponding color filter CF of the color filter layer CFL and the corresponding lens LS of the lens array LA in a plan view. In an area of the display area DA adjacent to the non-display area NDA, the center of each of the color filters CF and the center of each of the lenses LS may be shifted in a planar direction from the center of each of the openings OP of the corresponding pixel defining layer PDL in the third direction DR3. For example, in an area of the display area DA adjacent to the non-display area NDA, each of the openings OP of the pixel defining layer PDL may partially overlap the corresponding color filter CF of the color filter layer CFL and the corresponding lens of the lens array LA in a plan view. Accordingly, in the center of the display area DA, light emitted from the light emitting structure EMS may be efficiently outputted in the normal direction of the display surface. Light emitted from the light emitting structure EMS at the outside of the display area DA may be efficiently outputted in a direction inclined by an angle (e.g., a predetermined or selectable angle) with respect to the normal direction of the display surface.

The overcoat layer OC may be disposed on the lens array LA. The overcoat layer OC may cover (or overlap in a plan view) the optical functional layer OFL, the encapsulation layer TFE, the light emitting structure EMS, and/or the pixel circuit layer PCL. The overcoat layer OC may include various materials suitable for protecting lower layers thereof from foreign substances such as dust and moisture. For example, the overcoat layer OC may include at least one of an inorganic insulating film and an organic insulating film. For example, the overcoat layer OC may include epoxy, but embodiments are not limited thereto. The overcoat layer OC may have a lower refractive index than the lens array LA.

The cover window CW may be disposed on the overcoat layer OC. The cover window CW may protect lower layers thereof. The cover window CW may have a higher refractive index than the overcoat layer OC. The cover window CW may include glass, but embodiments are not limited thereto. For example, the cover window CW may be an encapsulation glass protecting constituent elements disposed thereunder. In other embodiments, the cover window CW may be omitted.

Figure 6:
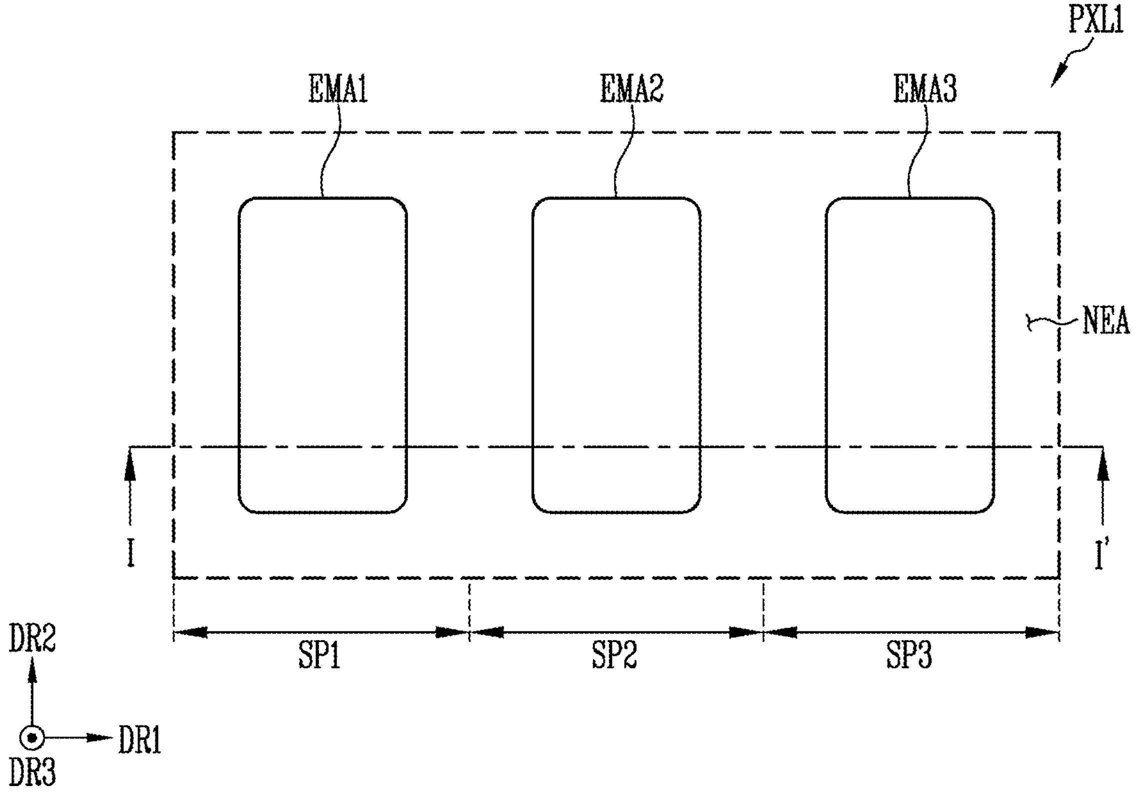
FIG. 6 illustrates a schematic plan view of one of pixels of FIG. 5 according to an embodiment.

FIG. 6 illustrates a schematic plan view of one of pixels of FIG. 5 according to an embodiment. For a clear and concise description in FIG. 6, the first pixel PXL1 among the first and second pixels PXL1 and PXL2 of FIG. 5 is schematically illustrated. The remaining pixels (e.g., the second pixel PXL2) may be the same or similar to the first pixel PXL1.

Referring to FIGS. 5 and 6, a first pixel PXL1 may include the first to third sub-pixels SP1 to SP3 disposed in the first direction DR1.

The first sub-pixel SP1 may include a first light emitting area EMA1 and a non-light emitting area NEA around (or adjacent to) the first light emitting area EMA1. The second sub-pixel SP2 may include a second light emitting area EMA2 and a non-light emitting area NEA around (or adjacent to) the second light emitting area EMA2. The third sub-pixel SP3 may include a third light emitting area EMA3 and a non-light emitting area NEA around (or adjacent to) the third light emitting area EMA3.

The first light emitting area EMA1 may be an area in which light is emitted from a portion of the light emitting layer (e.g., refer to FIG. 5) corresponding to the first sub-pixel SP1. The second light emitting area EMA2 may be an area in which light is emitted from a portion of the light emitting structure EMS corresponding to the second sub-pixel SP2. The third light emitting area EMA3 may be an area in which light is emitted from a portion of the light emitting structure EMS corresponding to the third sub-pixel SP3.

Figure 7:
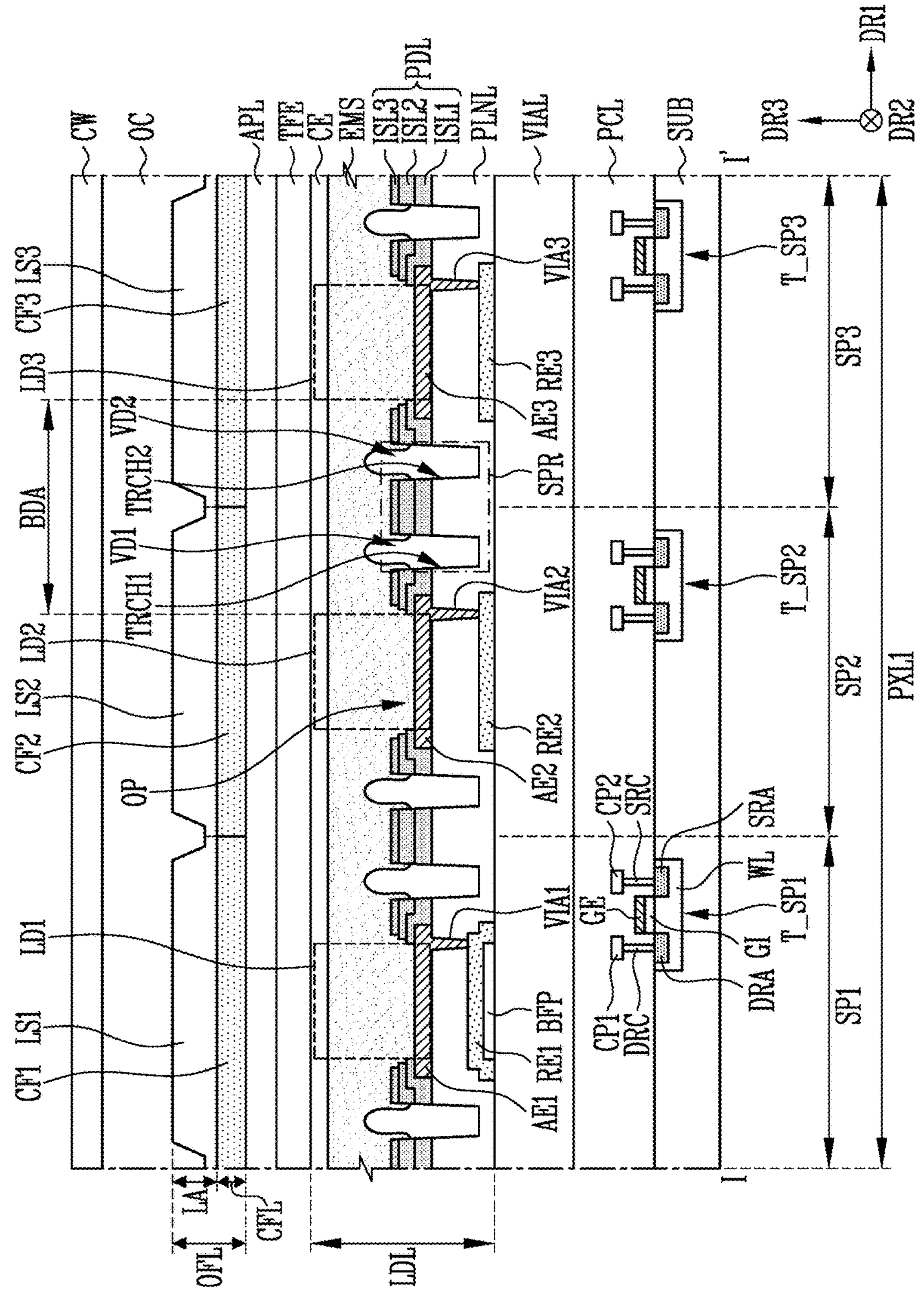
FIG. 7 illustrates a schematic cross-sectional view taken along line I-I' of FIG. 6 according to an embodiment.

FIG. 7 illustrates a schematic cross-sectional view taken along line I-I' of FIG. 6 according to an embodiment.

Referring to FIG. 7, the substrate SUB and the pixel circuit layer PCL disposed on the substrate SUB may be provided.

The substrate SUB may include a silicon wafer substrate formed using a semiconductor process. For example, the substrate SUB may include at least one of silicon, germanium, and silicon-germanium. However, the disclosure is not limited thereto.

The pixel circuit layer PCL may be disposed on the substrate SUB. The substrate SUB and the pixel circuit layer PCL may include circuit elements for each of the first to third sub-pixels SP1 to SP3. For example, the substrate SUB and the pixel circuit layer PCL may include a transistor T_SP1 of the first sub-pixel SP1, a transistor T_SP2 of the second sub-pixel SP2, and a transistor T_SP3 of the third sub-pixel SP3. The transistor T_SP1 of the first sub-pixel SP1 may be one of the transistors of (e.g., included in) the sub-pixel circuit SPC (e.g., refer to FIG. 2) of the first sub-pixel SP1. The transistor T_SP2 of the second sub-pixel SP2 may be one of the transistors of (e.g., included in) the sub-pixel circuit SPC of the second sub-pixel SP2. The transistor T_SP3 of the third sub-pixel SP3 may be one of the transistors of (e.g., included in) the sub-pixel circuit SPC of the third sub-pixel SP3. In FIG. 7, for clear and concise description, one of the transistors of each of the sub-pixels (e.g., the first to third sub-pixels SP1 to SP3) is shown and the remaining circuit elements are omitted.

The transistor T_SP1 of the first sub-pixel SP1 may include a source area SRA, a drain area DRA, and a gate electrode GE.

The source area SRA and the drain area DRA may be disposed in the substrate SUB. A well WL may be formed through an ion injection process, and disposed in the substrate SUB. The source area SRA and the drain area DRA may be spaced apart from each other in the well WL. The area between the source area SRA and the drain area DRA in the well WL may be defined as a channel area. The gate electrode GE may overlap the channel area between the source area SRA and the drain area DRA in a plan view, and may be disposed in the pixel circuit layer PCL. The gate electrode GE may be separated from the well WL or the channel area by a gate insulating layer GI including an insulating material. The gate electrode GE may include a conductive material.

Layers of (e.g., included in) the pixel circuit layer PCL may include insulating layers and conductive patterns disposed between the insulating layers, and the conductive patterns of the pixel circuit layer PCL may include first and second conductive patterns CP1 and CP2. The first conductive pattern CP1 may be electrically connected to the drain area DRA through a drain connection portion DRC penetrating one or more insulating layers. The second conductive pattern CP2 may be electrically connected to the source area SRA through a source connection portion SRC penetrating one or more insulating layers.

The gate electrode GE and the first and second conductive patterns CP1 and CP2 may be electrically connected to other circuit elements and/or wires, and the transistor T_SP1 of the first sub-pixel SP1 may be provided as (e.g., form) one of the transistors of the first sub-pixel SP1.

Each of the transistor T_SP2 of the second sub-pixel SP2 and the transistor T_SP3 of the third sub-pixel SP3 may be the same or similar to the transistor T_SP1 of the first sub-pixel SP1. Thus, detailed description of the same or similar constituent elements is omitted.

As described above, the substrate SUB and the pixel circuit layer PCL may include circuit elements for each of the first to third sub-pixels SP1 to SP3.

A via layer VIAL may be disposed on the pixel circuit layer PCL. The via layer VIAL may cover (or overlap in a plan view) the pixel circuit layer PCL, and may have an overall flat surface. The via layer VIAL may flatten (or planarize) steps on the pixel circuit layer PCL. The via layer VIAL may include at least one of a silicon oxide (SiOx), a silicon nitride (SiNx), and a silicon carbon nitride (SiCN), but embodiments are not limited thereto.

The light emitting element layer LDL may be disposed on the via layer VIAL. The light emitting element layer LDL may include first to third reflective electrodes RE1 to RE3, a planarization layer PLNL, first to third anode electrodes AE1 to AE3, a pixel defining layer PDL, a light emitting structure EMS, and a cathode electrode CE.

The first to third reflective electrodes RE1 to RE3 may be disposed in the first to third sub-pixels SP1 to SP3 on the via layer VIAL, respectively. Each of the first to third reflective electrodes RE1 to RE3 may contact a circuit element disposed on the pixel circuit layer PCL through a via penetrating the via layer VIAL.

The first to third reflective electrodes RE1 to RE3 may include (or function as) mirrors (e.g., full mirrors) that reflect (e.g., totally reflect) light emitted from the light emitting structure EMS toward the display surface (or the cover window CW). The first to third reflective electrodes RE1 to RE3 may include metallic materials suitable for reflecting light. The first to third reflective electrodes RE1 to RE3 may include at least one of aluminum (Al), silver (Ag), magnesium (Mg), platinum (Pt), palladium (Pd), gold (Au), nickel (Ni), neodymium (Nd), iridium (Ir), chromium (Cr), titanium (Ti) and an alloy of two or more materials selected therefrom, but embodiments are not limited thereto.

In the embodiments, a connection electrode may be disposed below each of the first to third reflective electrodes RE1 to RE3. The connection electrode may improve the electrical connection characteristics between the corresponding reflective electrode (e.g., one of the first to third reflective electrodes RE1 to RE3) and the circuit element of the pixel circuit layer PCL. The connection electrode may have a multi-layered structure. The multi-layered structure may include at least one of titanium (Ti), a titanium nitride (TiN), and a tantalum nitride (TaN), but embodiments are not limited thereto. In the embodiments, a corresponding reflective electrode (e.g., one of the first to third reflective electrodes RE1 to RE3) may be disposed between the multiple layers of the connecting electrode.

A buffer pattern BFP may be disposed below at least one of the first to third reflective electrodes RE1 to RE3. The buffer pattern BFP may include an inorganic material such as a silicon carbon nitride, but embodiments are not limited thereto. By disposing the buffer pattern BFP, the height of the corresponding reflective electrode (e.g., the first to third reflective electrodes RE1 to RE3) in the third direction DR3 may be adjusted. For example, the buffer pattern BFP may be disposed between the first reflective electrode RE1 and the via layer VIAL and adjust the height of the first reflective electrode RE1.

The first to third reflective electrodes RE1 to RE3 may include (or function as) mirrors (e.g., full mirrors), and the cathode electrode CE may include (or function as) a half mirror (may be translucent). For example, each of the first to third reflective electrodes RE1 to RE3 and the cathode electrode CE may provide a resonance structure in a corresponding sub-pixel. Light emitted from the light emitting layer of the light emitting structure EMS may be amplified by reciprocating between the reflective electrode and the cathode electrode CE, and the amplified light may be output through the cathode electrode CE. As such, the distance between each reflective electrode (e.g., the first to third reflective electrodes RE1 to RE3) and the cathode electrode CE may be the resonance distance for the light emitted from the light emitting layer of the corresponding light emitting structure EMS.

The first sub-pixel SP1 may have a shorter resonance distance than other sub-pixels due to the buffer pattern BFP. The resonance distance adjusted in this way (e.g., adjusted by the buffer pattern BEP) may allow light in a wavelength range (e.g., a specific or selectable wavelength range to be effectively and efficiently amplified. For example, the wavelength range of the light may be red color. Accordingly, the first sub-pixel SP1 may effectively and efficiently output light in the corresponding wavelength range.

In FIG. 7, the buffer pattern BFP may be provided in (e.g., only provided in) the first sub-pixel SP1 and not in the second and third sub-pixels SP2 and SP3, but the embodiments are not limited thereto. The buffer pattern BFP may be also provided in at least one of the second and third sub-pixels SP2 and SP3, and the resonance distance of at least one of the second and third sub-pixels SP2 and SP3 may be adjusted. For example, the first to third sub-pixels SP1 to SP3 may correspond to red, green, and blue, respectively. The distance between the first reflective electrode RE1 and the cathode electrode CE may be shorter than the distance between the second reflective electrode RE2 and the cathode electrode CE. The distance between the second reflective electrode RE2 and the cathode electrode CE may be shorter than the distance between the third reflective electrode RE3 and the cathode electrode CE.

To planarize the steps between the first to third reflective electrodes RE1 to RE3, the planarization layer PLNL may be disposed on the via layer VIAL and the first to third reflective electrodes RE1 to RE3. The planarization layer PLNL may cover (e.g., entirely cover or overlap in a plan view) the first to third reflective electrodes RE1 to RE3 and the via layer VIAL, and may have a flat surface. In the embodiments, the planarization layer PLNL may be omitted.

The first to third anode electrodes AE1 to AE3 respectively overlapping the first to third reflective electrodes RE1 to RE3 in a plan view may be disposed on the planarization layer PLNL. The first to third anode electrodes AE1 to AE3 may have shapes similar to the first to third light emitting areas EMA1 to EMA3 of FIG. 6 in the third direction DR3. The first to third anode electrodes AE1 to AE3 may be respectively connected to the first to third reflective electrodes RE1 to RE3. The first anode electrode AE1 may be electrically connected to the first reflective electrode RE1 through the first via VIA1 penetrating the planarization layer PLNL. The second anode electrode AE2 may be electrically connected to the second reflective electrode RE2 through the second via VIA2 penetrating the planarization layer PLNL. The third anode electrode AE3 may be electrically connected to the third reflective electrode RE3 through the third via VIA3 penetrating the planarization layer PLNL.

In embodiments, the first to third anode electrodes AE1 to AE3 may include at least one of transparent conductive materials such as an indium tin oxide (ITO), an indium zinc oxide (IZO), a zinc oxide ($ZnO_x$), an indium gallium zinc oxide (IGZO), and an indium tin zinc oxide (ITZO). However, the materials of the first to third anode electrodes AE1 to AE3 are not limited thereto. For example, the first to third anode electrodes AE1 to AE3 may include a titanium nitride.

The pixel defining layer PDL may be disposed on some of the first to third anode electrodes AE1 to AE3 and the planarization layer PLNL. The pixel defining layer PDL may have openings OP each exposing a portion of each of the first to third anode electrodes AE1 to AE3. An area overlapping the pixel defining layer PDL in a plan view may be a boundary area BDA between adjacent sub-pixels (e.g., adjacent ones of the first to third sub-pixels SP1 to SP3).

In embodiments, the pixel defining layer PDL may include inorganic insulating layers. Each of the inorganic insulating layers of the pixel defining layer PDL may include at least one of a silicon oxide ($SiO_x$) and a silicon nitride ($SiN_x$). For example, the pixel defining layer PDL may include a first inorganic insulating layer ISL1, a second inorganic insulating layer ISL2, and a third inorganic insulating layer ISL3 sequentially stacked each other. The first to third inorganic insulating layers ISL1 to ISL3 may include at least one of a silicon nitride, a silicon oxide, and a silicon oxynitride, but embodiments are not limited thereto. The first to third inorganic insulating layers ISL1 to ISL3 may have a step-shaped cross-section in an area adjacent to each of the openings OP.

The pixel defining layer PDL may include a separator SPR in the boundary area BDA between adjacent sub-pixels (e.g., adjacent ones of the first to third sub-pixels SP1 to SP3). For example, the separator SPR may be provided in each of the boundary areas between the sub-pixels SP in FIG. 4.

The separator SPR may form (or cause) a discontinuity to be formed in the light emitting structure EMS in the boundary area BDA. For example, the light emitting structure EMS may be disconnected or bent in the boundary area BDA by the separator SPR. Accordingly, the first to third light emitting areas EMA1 to EMA3 of FIG. 6 respectively corresponding to the first to third sub-pixels SP1 to SP3 may be defined according to the separator SPR of the pixel defining layer PDL.

The separator SPR may be provided in or on the pixel defining layer PDL. The pixel defining layer PDL may include one or more trenches TRCH1 and TRCH2 as the separator SPR in the boundary area BDA. In the embodiments, as shown in FIG. 7, one or more trenches TRCH1 and TRCH2 may penetrate the pixel defining layer PDL and partially penetrate the planarization layer PLNL. In other embodiments, one or more trenches TRCH1 and TRCH2 may penetrate the pixel defining layer PDL and the planarization layer PLNL, and may partially penetrate the via layer VIAL. In other embodiments, one or more trenches TRCH1 and TRCH2 may at least partially penetrate the planarization layer PLNL and/or the via layer VIAL, and a portion of the pixel defining layer PDL may be disposed in one or more trenches TRCH1 and TRCH2.

In FIG. 7, two trenches TRCH1 and TRCH2 may be provided in the boundary are BDA. However, embodiments are not limited thereto. For example, the pixel defining layer PDL may include a single trench in the boundary area BDA. In other embodiments, the pixel defining layer PDL may include three or more trenches in the boundary area BDA.

Due to the first and second trenches TRCH1 and TRCH2, discontinuous portions such as the first void VD1 and the second void VD2 may be formed in the light emitting structure EMS in the boundary area BDA. Some of the layers stacked each other in the light emitting structure EMS may be disconnected or bent by the first and second voids VD1 and VD2. For example, at least one charge generation layer and at least one hole injection layer of (e.g., included in) the light emitting structure EMS may be disconnected in the first and second voids VD1 and VD2. As described above, due to the first and second trenches TRCH1 and TRCH2, the portions of the light emitting structure EMS of (e.g., included in) the first to third sub-pixels SP1 to SP3 may be at least partially separated from each other.

Depending on the shapes of the first and second trenches TRCH1 and TRCH2, the discontinuities formed in the light emitting structure EMS may vary (e.g., may have various shapes).

In the embodiments, the light emitting structure EMS may be formed through processes such as vacuum deposition or inkjet printing. The same materials as the light emitting structure EMS may be disposed on the bottom surfaces of the first and second trenches TRCH1 and TRCH2 adjacent to the via layer VIAL.

The pixel defining layer PDL may include an additional separator, and the light emitting structure EMS may further include a discontinuous portion adjacent to the boundary area BDA. In embodiments, the uppermost third inorganic insulating layer ISL3 among the first to third inorganic insulating layers ISL1 to ISL3 of the pixel defining layer PDL may have a smaller width than the second inorganic insulating layer ISL2 disposed below (e.g., disposed directly below) the third inorganic insulating layer. For example, the pixel defining layer PDL may have a cross-section of a "T" or "I" shape in the boundary area BDA. However, the disclosure is not limited thereto, and the uppermost third inorganic insulating layer ISL3 may have a wider width than the second inorganic insulating layer ISL2. Depending on the shape of the pixel defining layer PDL, layers of (e.g., included in) the light emitting structure EMS may be at least partially disconnected or bent in the boundary area BDA or in an area adjacent to the boundary area BDA.

The light emitting structure EMS may be disposed on the anode electrodes AE exposed by the openings OP of the pixel defining layer PDL. The light emitting structure EMS may fill the openings OP of the pixel defining layer PDL, and may be disposed across (e.g., disposed entirely across) the first to third sub-pixels SP1 to SP3. As described above, the light emitting structure EMS may be at least partially disconnected or bent in the boundary area BDA by the separator SPR. Accordingly, in case that the display panel DP operates, the current (e.g., a leakage current) leaking from each of the first to third sub-pixels SP1 to SP3 to the neighboring sub-pixel through the layers of (e.g., included in) the light emitting structure EMS may decrease. Accordingly, the first to third light emitting elements LD1 to LD3 may operate with relatively high reliability.

The cathode electrode CE may be disposed on the light emitting structure EMS. The cathode electrode CE may be provided commonly for the first to third sub-pixels SP1 to SP3. The cathode electrode CE may include (or function as) a half mirror that partially transmits and partially reflects light emitted from the light emitting structure EMS. For example, the cathode electrode CE may be translucent.

The first anode electrode AE1, the portion of the light emitting structure EMS overlapping the first anode electrode AE1 in a plan view, and the portion of the cathode electrode CE overlapping the first anode electrode AE1 in a plan view may form (e.g., configure or be included in) the first light emitting element LD1. The second anode electrode AE2, the portion of the light emitting structure EMS overlapping the second anode electrode AE2 in a plan view, and the portion of the cathode electrode CE overlapping the second anode electrode AE2 in a plan view may form (e.g., configure or be included in) the second light emitting element LD2. The third anode electrode AE3, the portion of the light emitting structure EMS overlapping the third anode electrode AE3 in a plan view, and the portion of the cathode electrode CE overlapping the third anode electrode AE3 in a plan view may form (e.g., configure or be included in) the third light emitting element LD3.

The encapsulation layer TFE may be disposed on the cathode electrode CE. The encapsulation layer TFE may prevent oxygen and/or moisture from penetrating into the light emitting element layer LDL.

The optical functional layer OFL may be disposed on the encapsulation layer TFE. In embodiments, the optical functional layer OFL may be attached to the encapsulation layer TFE through an adhesive layer APL. For example, the optical functional layer OFL may be separately manufactured, and attached to the encapsulation layer TFE through the adhesive layer APL. The adhesive layer APL may further protect the lower layers including the encapsulation layer TFE.

The optical function layer OFL may include a color filter layer CFL and a lens array LA. The color filter layer CFL may include first to third color filters CF1 to CF3 of (e.g., corresponding to) the first to third sub-pixels SP1 to SP3, respectively. The first to third color filters CF1 to CF3 may pass (or transmit) light in different wavelength ranges. For example, the first to third color filters CF1 to CF3 may pass (or transmit) red, green, and blue colored light, respectively.

In embodiments, the first to third color filters CF1 to CF3 may overlap (e.g., partially overlap) each other in the boundary area BDA in a plan view. In other embodiments, the first to third color filters CF1 to CF3 may be spaced apart from each other, and a black matrix may be provided between the first to third color filters CF1 to CF3.

The lens array LA may be disposed on the color filter layer CFL. The lens array LA may include first to third lenses LS1 to LS3 respectively corresponding to the first to third sub-pixels SP1 to SP3. The first to third lenses LS1 to LS3 may improve light output efficiency by outputting the light emitted from the first to third light emitting elements LD1 to LD3, respectively, along an intended path.

The overcoat layer OC may be disposed on the lens array LA. The overcoat layer OC may protect lower layers of the overcoat layer OC from foreign substances such as dust, moisture, and the like. The cover window CW may be disposed on the overcoat layer OC.

Figure 8:
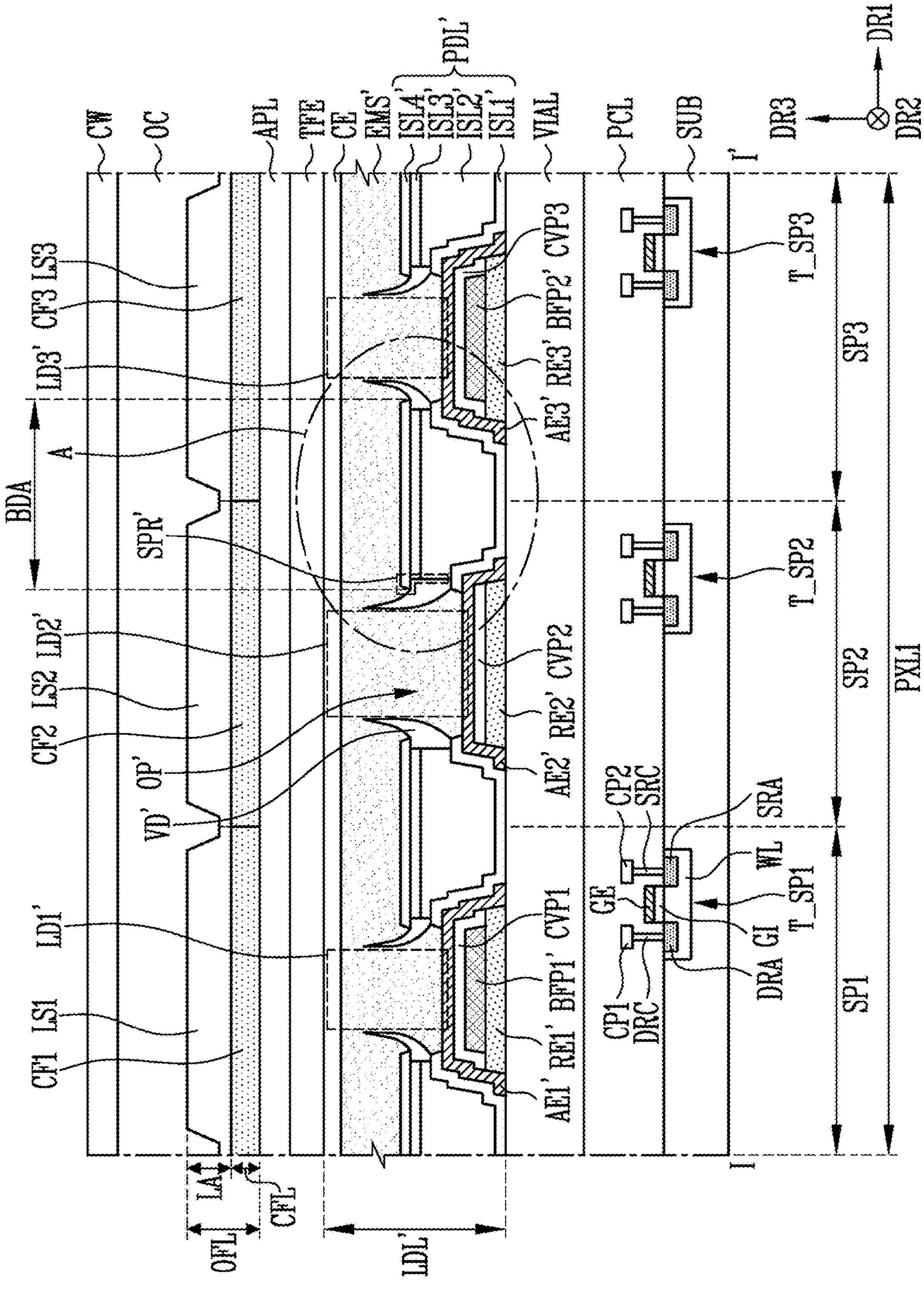
FIG. 8 illustrates a schematic cross-sectional view taken along line I-I' of FIG. 6 according to an embodiment.
Figure 9:
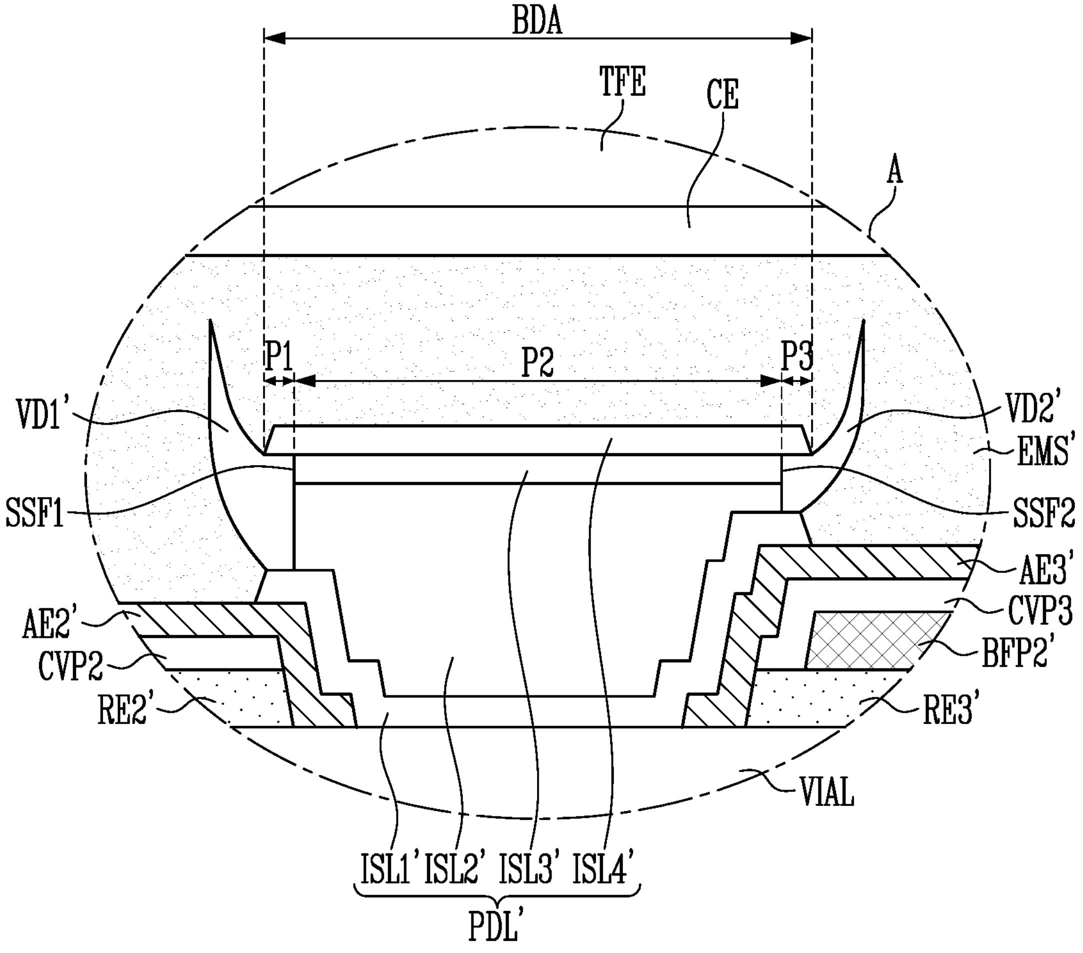
FIG. 9 illustrates a schematic enlarged view of area "A" of FIG. 8.

FIG. 8 illustrates a schematic cross-sectional view taken along line I-I' of FIG. 6 according to an embodiment. FIG. 9 illustrates a schematic enlarged view of area "A" of FIG. 8.

Referring to FIG. 8, a pixel circuit layer PCL and a via layer VIAL may be disposed on a substrate SUB. The substrate SUB, the pixel circuit layer PCL, and the via layer VIAL of FIG. 8 may be the same or similar to the substrate SUB, the pixel circuit layer PCL, and the via layer VIAL of FIG. 7. Hereinafter, detailed description of the same or similar constituent elements is omitted.

Alight emitting element layer LDL' may be disposed on the via layer VIAL. The light emitting element layer LDL' may include first to third reflective electrodes RE1' to RE3', first and second buffer patterns BFP1' and BFP2', first to third cover patterns CVP1 to CVP3, first to third anode electrodes AE1' to AE3', a pixel defining layer PDL', a light emitting structure EMS', and a cathode electrode CE.

The first to third reflective electrodes RE1' to RE3' may be disposed in the first to third sub-pixels SP1 to SP3 on the via layer VIAL, respectively. Each of the first to third reflective electrodes RE1' to RE3' may contact a circuit element disposed in the pixel circuit layer PCL through a via penetrating the via layer VIAL.

The first to third reflective electrodes RE1' to RE3' may reflect light emitted from the light emitting structure EMS' toward the display surface (or the cover window CW). The first to third reflective electrodes RE1' to RE3' may include metallic materials suitable for reflecting light. The first to third reflective electrodes RE1' to RE3' may include at least one of aluminum (Al), silver (Ag), magnesium (Mg), platinum (Pt), palladium (Pd), gold (Au), nickel (Ni), neodymium (Nd), iridium (Ir), chromium (Cr), titanium (Ti), and an alloy of two or more materials selected therefrom, but embodiments are not limited thereto.

In the embodiments, a connection electrode may be further provided between each of the first to third reflective electrodes RE1' to RE3' and the via layer VIAL. The connection electrode may improve the electrical connection characteristics between the corresponding reflective electrode (e.g., one of the first to third reflective electrodes RE1' to RE3') and the circuit element of the pixel circuit layer PCL. The connection electrode may have a multi-layered structure. The multi-layered structure may include at least one of titanium (Ti), aluminum (Al), a titanium nitride (TiN), and a tantalum nitride (TaN), but embodiments are not limited thereto. In the embodiments, a corresponding reflective electrode (e.g., one of the first to third reflective electrodes RE1' to RE3') may be disposed between the multiple layers of the connecting electrode.

A buffer pattern (e.g., the first buffer pattern BFP1' or the second buffer pattern BFP2') may be disposed on at least one of the first to third reflective electrodes RE1' to RE3'. In the embodiments, the first and second buffer patterns BFP1' and BFP2' may be disposed on the first and third reflective electrodes RE1' and RE3', respectively. Heights of the first and third anode electrodes AE1' and AE3' in the third direction DR3 may be adjusted by the first and second buffer patterns BFP1' and BFP2'. The first and second buffer patterns BFP1' and BFP2' may include an inorganic material including at least one of a silicon oxide (SiOx) and a silicon nitride (SiNx), but embodiments are not limited thereto.

The first to third cover patterns CVP1 to CVP3 may be disposed on the first to third reflective electrodes RE1' to RE3', respectively. In the first sub-pixel SP1, the first cover pattern CVP1 may be disposed on the first reflective electrode RE1' and the first buffer pattern BFP1'. In the second sub-pixel SP2, the second cover pattern CVP2 may be disposed on the second reflective electrode RE2'. In the third sub-pixel SP3, the third cover pattern CVP3 may be disposed on the third reflective electrode RE3' and the second buffer pattern BFP2'. The first to third cover patterns CVP1 to CVP3 may be formed after the formation of the first and second buffer patterns BFP1' and BFP2' during the manufacturing process. The first to third cover patterns CVP1 to CVP3 may include the same material as the first and second buffer patterns BFP1' and BFP2'. For example, the first to third cover patterns CVP1 to CVP3 may include inorganic materials including at least one of a silicon oxide ($SiO_x$) and a silicon nitride (SiNx), but embodiments are not limited thereto.

The first to third anode electrodes AE1' to AE3' may be disposed on the first to third cover patterns CVP1 to CVP3, respectively. In the embodiments, the first anode electrode AE1' may cover (or overlap in a plan view) the first cover pattern CVP1, the first buffer pattern BFP1', and the first reflective electrode RE1'. The second anode electrode AE2' may cover (or overlap in a plan view) the second cover pattern CVP2 and the second reflective electrode RE2'. The third anode electrode AE3' may cover (or overlap in a plan view) the third cover pattern CVP3, the second buffer pattern BFP2', and the third reflective electrode RE3'.

The first to third anode electrodes AE1' to AE3' may be electrically connected to the first to third reflective electrodes RE1' to RE3', respectively. For example, each anode electrode (e.g., each of the first to third anode electrodes AE1' to AE3') may be electrically connected to an end (or edge) of the corresponding reflective electrode (e.g., one of the first to third reflective electrodes RE1' to RE3'). However, embodiments are not limited thereto. To improve the electrical connection characteristics between the anode electrode and the reflective electrode, the anode electrode may be electrically connected to the reflective electrode in various ways.

In embodiments, the first to third anode electrodes AE1' to AE3' may include at least one of transparent conductive materials such as an indium tin oxide (ITO), an indium zinc oxide (IZO), a zinc oxide ($ZnO_x$), an indium gallium zinc oxide (IGZO), and an indium tin zinc oxide (ITZO). However, the materials of the first to third anode electrodes AE1' to AE3' are not limited thereto. For example, the first to third anode electrodes AE1' to AE3' may include a titanium nitride.

The first to third anode electrodes AE1' to AE3' may have shapes similar to the first to third light emitting areas EMA1 to EMA3 of FIG. 6 in the third direction DR3.

The first to third anode electrodes AE1' to AE3' and the cathode electrode CE may reflect (e.g., partially reflect) incident light. Light emitted from the light emitting layer of the light emitting structure EMS' may be amplified by reciprocating between the anode electrode and the cathode electrode CE, and may be outputted through the cathode electrode CE. For example, each anode electrode (each of the first to third anode electrodes AE1' to AE3') and the cathode electrode CE may provide a resonance structure in a corresponding sub-pixel (e.g., one of the first to third sub-pixels SP1 to SP3). The distance between each anode electrode (each of the first to third anode electrodes AE1' to AE3') and the cathode electrode CE may be the resonance distance for the light emitted from the light emitting layer of the corresponding light emitting structure EMS.

The first to third sub-pixels SP1 to SP3 may correspond to red, green, and blue, respectively. Heights of the first and third anode electrodes AE1' and AE3' in the third direction DR3 may be higher than the second anode electrode AE2' by the first and second buffer patterns BFP1' and BFP2'. Accordingly, the first and third sub-pixels SP1 and SP3 may have a shorter resonance distance than the second sub-pixel SP2 due to the first and second buffer patterns BFP1' and BFP2'. Thus, the resonance distance of each sub-pixel (e.g., each of the first to third sub-pixels SP1 to SP3) may be adjusted, and light in the wavelength range of the corresponding color (e.g., one of the red, green, and blue) may be effectively and efficiently amplified.

In FIG. 8, the first and second buffer patterns BFP1' and BFP2' may be respectively disposed below the first and third anode electrodes AE1' and AE3', but embodiments are not limited thereto. For example, one of the first and second buffer patterns BFP1' and BFP2' may be omitted. In other embodiments, the first and second buffer patterns BFP1' and BFP2' may be omitted. The resonance distances between respective anode electrodes and the cathode electrode CE may be the same or similar to each other. In other embodiments, a buffer pattern may be disposed below each of the first to third anode electrodes AE1' to AE3'. The buffer patterns disposed below respective anode electrodes (e.g., the first to third anode electrodes AE1' to AE3') may have different thicknesses, and accordingly, the resonance distances between respective anode electrodes (e.g., the first to third anode electrodes AE1 to AE3') and the cathode electrode CE may be different from each other. As described above, the buffer pattern for adjusting the height of the anode electrode may be disposed (or provided) below at least one of the first to third anode electrodes AE1' to AE3', and the resonance distance in each sub-pixel (e.g., each of the first to third sub-pixels SP1 to SP3) may be optimized.

The pixel defining layer PDL' may be disposed on portions of the first to third anode electrodes AE1' to AE3' and on the via layer VIAL. The pixel defining layer PDL' may have openings OP' each exposing a portion of each of the first to third anode electrodes AE1' to AE3'. An area overlapping the pixel defining layer PDL' in a plan view may be the boundary area BDA between adjacent sub-pixels (e.g., adjacent ones of the first to third sub-pixels SP1 to SP3).

The pixel defining layer PDL' may include inorganic insulating layers sequentially stacked each other. Each of the inorganic insulating layers may include at least one of a silicon oxide ($SiO_x$) and a silicon nitride ($SiN_x$). However, embodiments are not limited thereto. For example, the pixel defining layer PDL' may include an organic insulating layer.

In embodiments, the pixel defining layer PDL' may include first to fourth inorganic insulating layers ISL1' to ISL4'. The first inorganic insulating layer ISL1' may cover (or overlap in a plan view) portions of the first to third anode electrodes AE1' to AE3' and the via layer VIAL. The second inorganic insulating layer ISL2' may be disposed on the first inorganic insulating layer ISL1', the third inorganic insulating layer ISL3' may be disposed on the second inorganic insulating layer ISL2', and the fourth inorganic insulating layer ISL4' may be disposed on the third inorganic insulating layer ISL3'. The first and third inorganic insulating layers ISL1' and ISL3' may include a silicon nitride (SiNx), and the second and fourth inorganic insulating layers ISL2' and ISL4' may include a silicon oxide ($SiO_x$), but embodiments are not limited thereto. In embodiments, the first inorganic insulating layer ISL1' may be omitted.

The pixel defining layer PDL' may include a separator SPR' in the boundary area BDA between adjacent sub-pixels (e.g., adjacent ones of the first to third sub-pixels SP1 to SP3). The separator SPR' may form (or cause) a discontinuous part such as a void VD' in the light emitting structure EMS'. Due to the discontinuous portion, at least some of the layers of (e.g., included in) the light emitting structure EMS' may be disconnected or bent.

The fourth inorganic insulating layer ISL4' may have a wider width than the second and third inorganic insulating layers ISL2' and ISL3'. Side surfaces of the second to fourth inorganic insulating layers ISL2' to ISL4' adjacent to the openings OP' may be provided as (e.g., form) the separator SPR'.

Referring to FIGS. 8 and 9, the fourth inorganic insulating layer ISL4' may include first to third portions P1 to P3. The second portion P2 may overlap (e.g., completely overlap) the second and third inorganic insulating layers ISL2' and ISL3' in a plan view. The first portion P1 may protrude from the second portion P2 in a direction opposite to the first direction DR1. The third portion P3 may protrude from the second portion P2 in the first direction DR1. As such, a width of the fourth inorganic insulating layer ISL4' may be wider than those of the second and third inorganic insulating layers ISL2' and ISL3'. For example, during the manufacturing process, the second and third inorganic insulating layers ISL2' and ISL3' may be undercut, and may not include portions overlapping the first and third portions P1 and P3 in a plan view. For example, each of the first and third portions P1 and P3 of the fourth inorganic insulating layer ISL4' may have an eave shape on the second and third inorganic insulating layers ISL2' and ISL3'.

In the boundary area BDA, the second and third inorganic insulating layers ISL2' and ISL3' may have the same width. However, embodiments are not limited thereto, and the second and third inorganic insulating layers ISL2' and ISL3' may have different widths from each other. For example, the second inorganic insulating layer ISL2' may have a wider width than the third inorganic insulating layer ISL3'. In other embodiments, the third inorganic insulating layer ISL3' may have a wider width than the second inorganic insulating layer ISL2'.

In the second sub-pixel SP2, the first portion P1 of the fourth inorganic insulating layer ISL4' and the first side surface SSF1 of the second and third inorganic insulating layers ISL2' and ISL3' may be provided as (e.g., form) a separator SPR'. Accordingly, the first void VD1' adjacent to the first portion P1 of the fourth inorganic insulating layer ISL4' may be formed in the light emitting structure EMS'. In the third sub-pixel SP3, the third portion P3 of the fourth inorganic insulating layer ISL4' and the second side surface SSF2 of the second and third inorganic insulating layers ISL2' and ISL3' may be provided as (e.g., form) another separator SPR'. Accordingly, the second void VD2' adjacent to the third portion P3 of the fourth inorganic insulating layer ISL4' may be formed in the light emitting structure EMS'.

Some of the layers stacked each other in the light emitting structure EMS' may be disconnected or bent by the first and second voids VD1' and VD2'. For example, at least one charge generation layer and at least one hole injection layer of (e.g., included in) the light emitting structure EMS' may be disconnected by the first and second voids VD1' and VD2'. As described above, due to the separator SPR', the portions of the light emitting structure EMS' of (e.g., included in) the first to third sub-pixels SP1 to SP3 may be at least partially separated from each other.

The pixel defining layer PDL' may include an additional separator, and the light emitting structure EMS' may further include a discontinuous portion in the boundary area BDA. In the embodiments, the pixel defining layer PDL' may include one or more trenches as a separator in the boundary area BDA. The trenches may penetrate one or more of the first to fourth inorganic insulating layers ISL1' to ISL4'. Due to the trenches, some of the layers stacked each other in the light emitting structure EMS', for example, at least one charge generation layer and at least one hole injection layer, may be disconnected or bent. In embodiments, the light emitting structure EML may have a structure in which three light emitting portions each including a light emitting layer are stacked each other, and two charge generation layers may be disposed between the three light emitting portions. In the embodiments, the pixel defining layer PDL' may include one or more trenches in the boundary area BDA.

Referring again to FIG. 8, the light emitting structure EMS' may be disposed on the anode electrodes (e.g., the first to third anode electrodes AE1 to AE3) exposed by the openings OP' of the pixel defining layer PDL'. The light emitting structure EMS' may fill the openings OP' of the pixel defining layer PDL', and may be disposed across (e.g., disposed entirely across) the first to third sub-pixels SP1 to SP3. As described above, the light emitting structure EMS' may be disconnected or bent in the boundary area BDA or an area adjacent to the boundary area BDA by the separator SPR'. Accordingly, during the operation of the display panel DP (e.g., refer to FIG. 4), the current (e.g., a leakage current) flowing out from each of the first to third sub-pixels SP1 to SP3 through the layers of (e.g., included in) the light emitting structure EMS' may decrease. Accordingly, the first to third light emitting elements LD1' to LD3' may operate with relatively high reliability.

In the embodiments, the light emitting structure EMS' may include two light emitting portions sequentially stacked each other, and each of the light emitting portions may include a light emitting layer generating light according to an applied current. In other embodiments, the light emitting structure EMS' may include three light emitting portions sequentially stacked each other, and each of the light emitting portions may include a light emitting layer generating light according to an applied current. In embodiments, a charge generation layer may be disposed between the light emitting portions.

In the embodiments, the light emitting structure EMS' may be formed through processes such as vacuum deposition or inkjet printing.

The cathode electrode CE may be disposed on the light emitting structure EMS'. The cathode electrode CE may be provided commonly for the first to third sub-pixels SP1 to SP3.

The first anode electrode AE1', the portion of the light emitting structure EMS' overlapping the first anode electrode AE1' in a plan view, and the portion of the cathode electrode CE overlapping the first anode electrode AE1' in a plan view may form (e.g., configure or be included in) the first light emitting element LD1'. The second anode electrode AE2', the portion of the light emitting structure EMS' overlapping the second anode electrode AE2' in a plan view, and the portion of the cathode electrode CE overlapping the second anode electrode AE2' in a plan view may form (e.g., configure or be included in) the second light emitting element LD2'. The third anode electrode AE3', the portion of the light emitting structure EMS' overlapping the third anode electrode AE3' in a plan view, and the portion of the cathode electrode CE overlapping the third anode electrode AE3' in a plan view may form (e.g., configure or be included in) the third light emitting element LD3'.

The encapsulation layer TFE may be disposed on the cathode electrode CE. The encapsulation layer TFE may prevent oxygen and/or moisture from penetrating into the light emitting element layer LDL'.

An adhesive layer APL, an optical functional layer OFL, an overcoat layer OC, and a cover window CW may be disposed on the encapsulation layer TFE. The adhesive layer APL, the optical functional layer OFL, the overcoat layer OC, and the cover window CW may be the same or similar to the adhesive layer APL, the optical functional layer OFL, the overcoat layer OC, and the cover window CW of FIG. 7, respectively. Detailed description of the same or similar constituent elements omitted.

Figure 10:
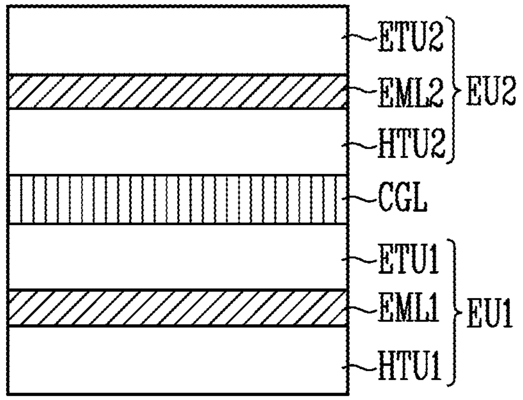
FIG. 10 illustrates a schematic cross-sectional view of a portion of a light emitting structure included in one of first to third light emitting elements of FIG. 7 or FIG. 8 according to an embodiment.

FIG. 10 illustrates a schematic cross-sectional view of a portion of a light emitting structure included in one of first to third light emitting elements of FIG. 7 (or FIG. 8) according to an embodiment.

Referring to FIG. 10, the light emitting structure may have a tandem structure in which first and second light emitting portions EU1 and EU2 are stacked each other. The light emitting structure may be substantially the same or similar to each of the first to third light emitting elements LD1 to LD3 of FIG. 7 and the like.

Each of the first and second light emitting portions EU1 and EU2 may include at least one light emitting layer that generates light according to a current applied thereto. The first light emitting portion EU1 may include a first light emitting layer EML1, a first electron transport portion ETU1, and a first hole transport portion HTU1. The first light emitting layer EML1 may be disposed between the first electron transport portion ETU1 and the first hole transport portion HTU1. The second light emitting portion EU2 may include a second light emitting layer EML2, a second electron transport portion ETU2, and a second hole transport portion HTU2. The second light emitting layer EML2 may be disposed between the second electron transport portion ETU2 and the second hole transport portion HTU2.

Each of the first and second hole transport portions HTU1 and HTU2 may include at least one of a hole injection layer and a hole transport layer, and may further include a hole buffer layer, an electron blocking layer, or the like as needed. The first and second hole transport portions HTU1 and HTU2 may have the same configuration or different configurations from each other.

Each of the first and second electron transport portions ETU1 and ETU2 may include at least one of an electron injection layer and an electron transport layer, and may further include an electron buffer layer and a hole blocking layer as needed. The first and second electron transport portions ETU1 and ETU2 may have the same configuration or different configurations from each other.

A connection layer, which may be provided in the form of a charge generation layer CGL, may be disposed between the first light emitting portion EU1 and the second light emitting portion EU2 and electrically connect the first and second light emitting portions EU1 and EU2 to each other. In embodiments, the charge generation layer CGL may have a stacked structure of a p dopant layer and an n dopant layer. For example, the p dopant layer may include a p-type dopant including at least one of HAT-CN, TCNQ, and NDP-9, and the n dopant layer may include at least one of an alkali metal, an alkaline earth metal, and a lanthanide-based metal. However, embodiments are not limited thereto.

In the embodiments, the first light emitting layer EML1 and the second light emitting layer EML2 may generate light of different colors. The light emitted from each of the first light emitting layer EML1 and the second light emitting layer EML2 may be mixed to be recognized as white light. For example, the first light emitting layer EML1 may generate blue-colored light, and the second light emitting layer EML2 may generate yellow-colored light. In the embodiments, the second light-emitting layer EML2 may include a structure in which a first sub-light-emitting layer generating red-colored light and a second sub-light-emitting layer generating green-colored light are stacked each other. The red-colored light and the green-colored light may be mixed to provide yellow-colored light. An intermediate layer transporting holes and/or preventing transport of electrons may be further disposed between the first and second sub-light emitting layers.

In other embodiments, the first light emitting layer EML1 and the second light emitting layer EML2 may generate light of the same color.

The light emitting structure may be formed through a vacuum deposition method, an inkjet printing method, or the like, but embodiments are not limited thereto.

Figure 11:
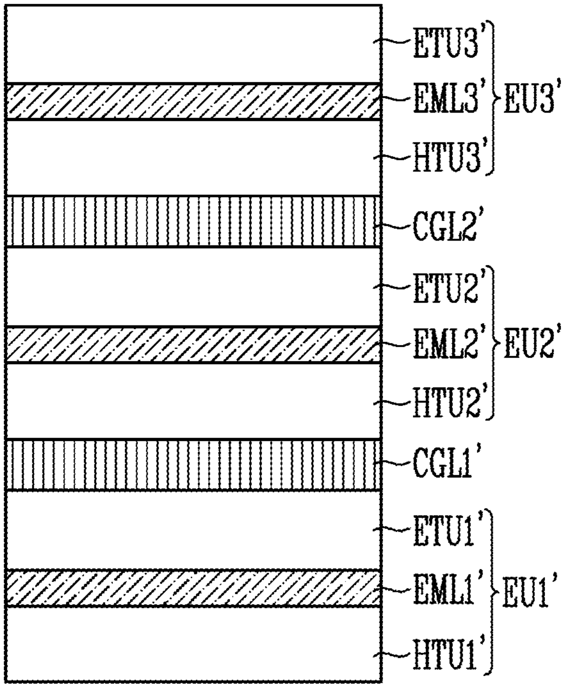
FIG. 11 illustrates a schematic cross-sectional view of a portion of a light emitting structure included in one of first to third light emitting elements of FIG. 7 or FIG. 8 according to an embodiment.

FIG. 11 illustrates a schematic cross-sectional view of a portion of a light emitting structure included in one of first to third light emitting elements of FIG. 7 (or FIG. 8) according to an embodiment.

Referring to FIG. 11, the light emitting structure may have a tandem structure in which first to third light emitting portions EU1' to EU3' are stacked each other. The light emitting structure may be substantially the same or similar to each of the first to third light emitting elements LD1 to LD3 of FIG. 7 and the like.

Each of the first to third light emitting portions EU1' to EU3' may include a light emitting layer that generates light according to a current applied thereto. The first light emitting portion EU1' may include a first light emitting layer EML1', a first electron transport portion ETU1', and a first hole transport portion HTU1'. The first light emitting layer EML1' may be disposed between the first electron transport portion ETU1' and the first hole transport portion HTU1'. The second light emitting portion EU2' may include a second light emitting layer EML2', a second electron transport portion ETU2', and a second hole transport portion HTU2'. The second light emitting layer EML2' may be disposed between the second electron transport portion ETU2' and the second hole transport portion HTU2'. The third light emitting portion EU3' may include a third light emitting layer EML3', a third electron transport portion ETU3', and a third hole transport portion HTU3'. The third light emitting layer EML3' may be disposed between the third electron transport portion ETU3' and the third hole transport portion HTU3'.

Each of the first to third hole transport portions HTU1' to HTU3' may include at least one of a hole injection layer and a hole transport layer, and may further include a hole buffer layer, an electron blocking layer, or the like as needed. The first to third hole transport portions HTU1' to HTU3' may have the same configuration or different configurations from each other.

Each of the first to third electron transport portions ETU1' to ETU3' may include at least one of an electron injection layer and an electron transport layer, and may further include an electron buffer layer and a hole blocking layer as needed. The first to third electron transport portions ETU1' to ETU3' may have the same configuration or different configurations from each other.

A first charge generation layer CGL1' may be disposed between the first light emitting portion EU1' and the second light emitting portion EU2'. A second charge generation layer CGL2' may be disposed between the second light emitting portion EU2' and the third light emitting portion EU3'.

In the embodiments, the first to third light emitting layers EML1' to EML3' may generate light of different colors. Light emitted from each of the first to third light emitting layers EML1' to EML3' may be mixed, and white light may be viewed. For example, the first light emitting layer EML1' may generate light of a blue color, the second light emitting layer EML2' may generate light of a green color, and the third light emitting layer EML3' may generate light of a red color.

In other embodiments, two or more of the first to third light emitting layers EML1' to EML3' may generate light of the same color.

Unlike shown in FIGS. 10 and 11, the light emitting structure of FIG. 7 (or FIG. 8) may include a light emitting portion in each of the first to third light emitting elements LD1 to LD3. The light emitting portions respectively included in the first to third light emitting elements LD1 to LD3 may emit light of different colors. For example, the light emitting portion of the first light emitting element LD1 may emit red-colored light, the light emitting portion of the second light emitting element LD2 may emit green-colored light, and the light emitting portion of the third light emitting element LD3 may emit blue-colored light. The light emitting portions of the first to third sub-pixels SP1 to SP3 may be separated from each other, and each of the light emitting portions may be disposed in the opening (e.g., the opening OP in FIG. 7 and the opening OP' in FIG. 8) of the pixel defining layer (e.g., the pixel defining layer PDL in FIG. 7 and the pixel defining layer PDL' in FIG. 8). At least some of the color filters CF1 to CF3 may be omitted.

Figure 12:
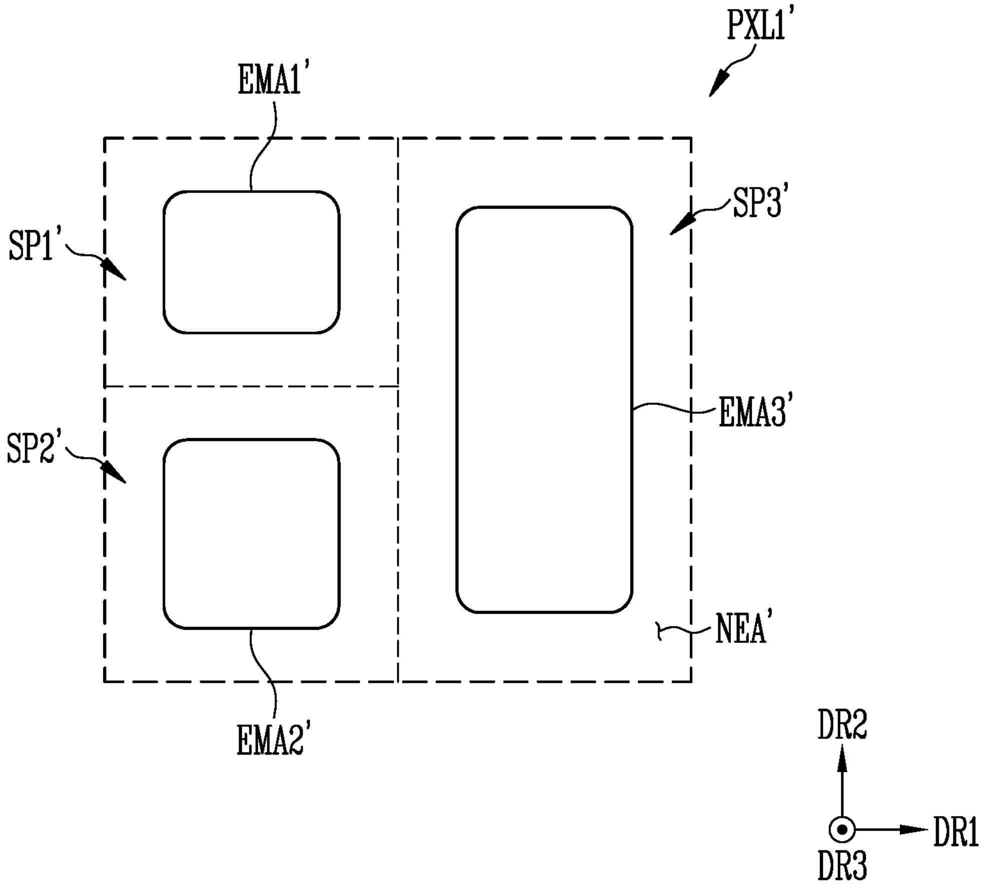
FIG. 12 illustrates a schematic plan view of one of pixels of FIG. 5 according to an embodiment.

FIG. 12 illustrates a schematic plan view of one of pixels of FIG. 5 according to an embodiment.

Referring to FIG. 12, a first pixel PXL1' may include first to third sub-pixels SP1' to SP3'.

The first sub-pixel SP1' may include a first light emitting area EMA1' and a non-light emitting area NEA' around (or adjacent to) the first light emitting area EMA1'. The second sub-pixel SP2' may include a second light emitting area EMA2' and a non-light emitting area NEA' around (or adjacent to) the second light emitting area EMA2'. The third sub-pixel SP3' may include a third light emitting area EMA3' and a non-light emitting area NEA' around (or adjacent to) the third light emitting area EMA3'.

The first sub-pixel SP1' and the second sub-pixel SP2' may be disposed in the second direction DR2. The third sub-pixel SP3' may be disposed in the first direction DR1 with respect to each of the first and second sub-pixels SP1' and SP2'.

The second sub-pixel SP2' may have a larger area than the first sub-pixel SP1', and the third sub-pixel SP3' may have a larger area than the second sub-pixel SP2'. Accordingly, the second light emitting area EMA2' may have a larger area than the first light emitting area EMA1', and the third light emitting area EMA3' may have a larger area than the second light emitting area EMA2'. However, embodiments are not limited thereto. For example, the first and second sub-pixels SP1' and SP2' may have substantially the same area, and the third sub-pixel SP3' may have a larger area than each of the first and second sub-pixels SP1' and SP2'. As such, the areas of the first to third sub-pixels SP1' to SP3' may be variously changed depending on embodiments.

Figure 13:
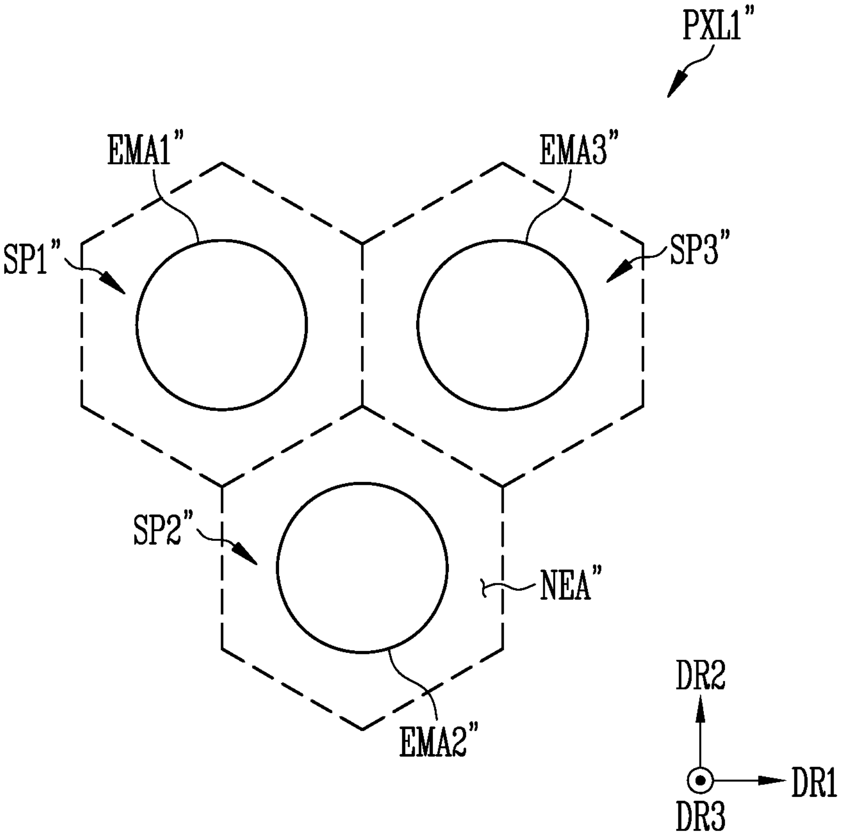
FIG. 13 illustrates a schematic plan view of one of pixels of FIG. 5 according to an embodiment.

FIG. 13 illustrates a schematic plan view of one of pixels of FIG. 5 according to an embodiment.

Referring to FIG. 13, the first sub-pixel SP1" may include a first light emitting area EMA1" and a non-light emitting area NEA" around (or adjacent to) the first light emitting area EMA1". The second sub-pixel SP2" may include a second light emitting area EMA2" and a non-light emitting area NEA" around (or adjacent to) the second light emitting area EMA2". The third sub-pixel SP3" may include a third light emitting area EMA3" and anon-light emitting area NEA" around (or adjacent to) the third light emitting area EMA3".

The first to third sub-pixels SP1" to SP3" may have polygonal shapes in the third direction DR3. For example, the shapes of the first to third sub-pixels SP1" to SP3" may have hexagonal shapes as shown in FIG. 13.

The first to third light emitting areas EMA1" to EMA3" may have circular shapes in the third direction DR3. However, embodiments are not limited thereto. For example, each of the first to third light emitting areas EMA1" to EMA3" may have a polygonal shape.

The first and third sub-pixels SP1" and SP3" may be disposed in the first direction DR1. The second sub-pixel SP2" may be disposed in a direction (or a diagonal direction) inclined by an acute angle with respect to the second direction DR2 with respect to the first sub-pixel SP1".

The dispositions of the sub-pixels illustrated in FIGS. 6, 12, and 13 are merely examples, and embodiments are not limited thereto. Each pixel may include two or more sub-pixels, and the sub-pixels may be variously disposed. Each of the sub-pixels may have various shapes, and each of light emitting areas of the sub-pixels may also have various shapes.

Figure 14:
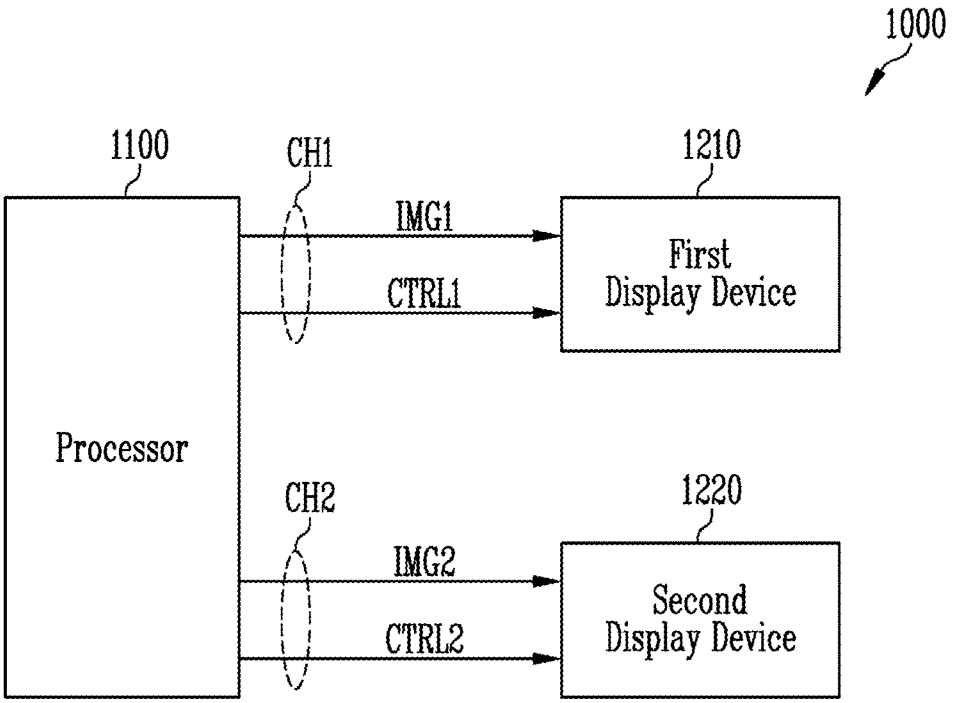
FIG. 14 illustrates a schematic block diagram of a display system according to an embodiment.

FIG. 14 illustrates a schematic block diagram of a display system according to an embodiment.

Referring to FIG. 14, the display system (e.g., an electronic device) 1000 may include a processor 1100 and one or more display devices 1210 and 1220.

The processor 1100 may perform various tasks and calculations. In embodiments, the processor 1100 may include an application processor, a graphics processor, a microprocessor, a central processing unit (CPU), and the like. The processor 1100 may be electrically connected to other constituent elements of the display system 1000 through a bus system, and may control the elements of the display system 1000.

In FIG. 14, the display system 1000 may include the first and second display devices 1210 and 1220. The processor 1100 may be electrically connected to the first display device 1210 through a first channel CH1 and to the second display device 1220 through a second channel CH2.

Through the first channel CH1, the processor 1100 may transmit first image data IMG1 and a first control signal CTRL1 to the first display device 1210. The first display device 1210 may display an image based on the first image data IMG1 and the first control signal CTRL1. The first display device 1210 may be the same or similar to the display device 100 described with reference to FIG. 1. The first image data IMG1 and the first control signal CTRL1 may be provided as (e.g., be the same or similar to) the input image data IMG and the control signal CTRL of FIG. 1, respectively.

Through the second channel CH2, the processor 1100 may transmit second image data IMG2 and a second control signal CTRL2 to the second display device 1220. The second display device 1220 may display an image based on the second image data IMG2 and the second control signal CTRL2. The second display device 1220 may be the same or similar to the display device 100 described with reference to FIG. 1. The second image data IMG2 and the second control signal CTRL2 may be provided as (e.g., be the same or similar to) the input image data IMG and the control signal CTRL of FIG. 1, respectively.

The display system (e.g., the electronic device) 1000 may include a computing system providing image display functions such as a portable computer, a mobile phone, a smart phone, a tablet personal computer (PC), a smart watch, a watch phone, a portable multimedia player (PMP), a navigation system, and an ultra mobile personal computer (UMPC). The display system 1000 may include at least one of a head-mounted display device (HMD), a virtual reality (VR) device, a mixed reality (MR) device, and an augmented reality (AR) device.

Figure 15:
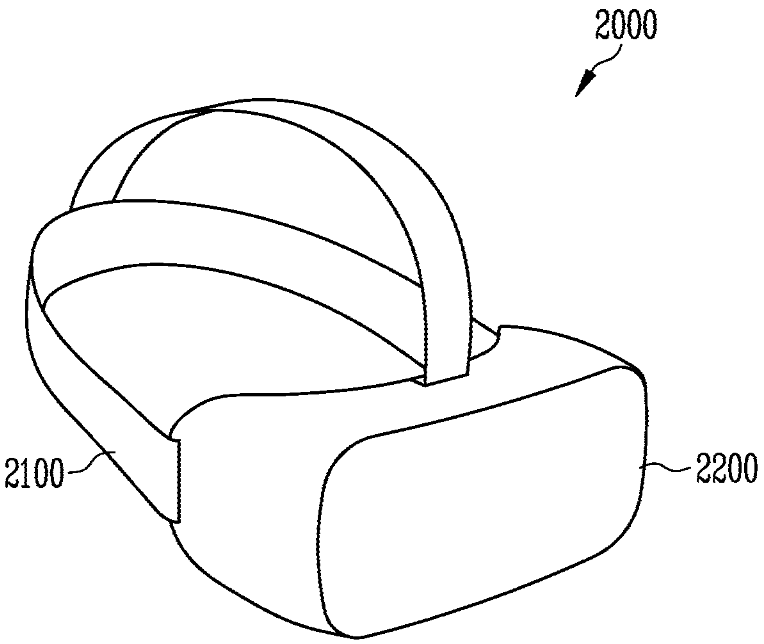
FIG. 15 illustrates a schematic perspective view of an application example of the display system of FIG. 14.

FIG. 15 illustrates a schematic perspective view of an application example of the display system of FIG. 14.

Referring to FIG. 15, the display system (e.g., the electronic device) 1000 of FIG. 14 may be applied to a head-mounted display device 2000. The head-mounted display device 2000 may be a wearable electronic device that may be worn on the user's head.

The head-mounted display device 2000 may include a head-mounted band 2100 and a display device accommodation case 2200. The head-mounted band 2100 may be connected to the display device accommodation case 2200. For example, the head-mounted band 2100 may extend from an end of the display device accommodation case 2200 to another end of the display device accommodation case 2200. The head-mounted band 2100 may include a horizontal band and/or a vertical band for fixing the head-mounted display device 2000 to the user's head. The horizontal band may surround the side portion of the user's head, and the vertical band may surround the upper portion of the user's head. However, embodiments are not limited thereto. For example, the head-mounted band 2100 may be implemented in the form of a spectacle frame, a helmet, or the like.

The display device accommodation case 2200 may accommodate the first and second display devices 1210 and 1220 of FIG. 14. The display device accommodation case 2200 may further accommodate the processor 1100 of FIG. 14.

Figure 16:
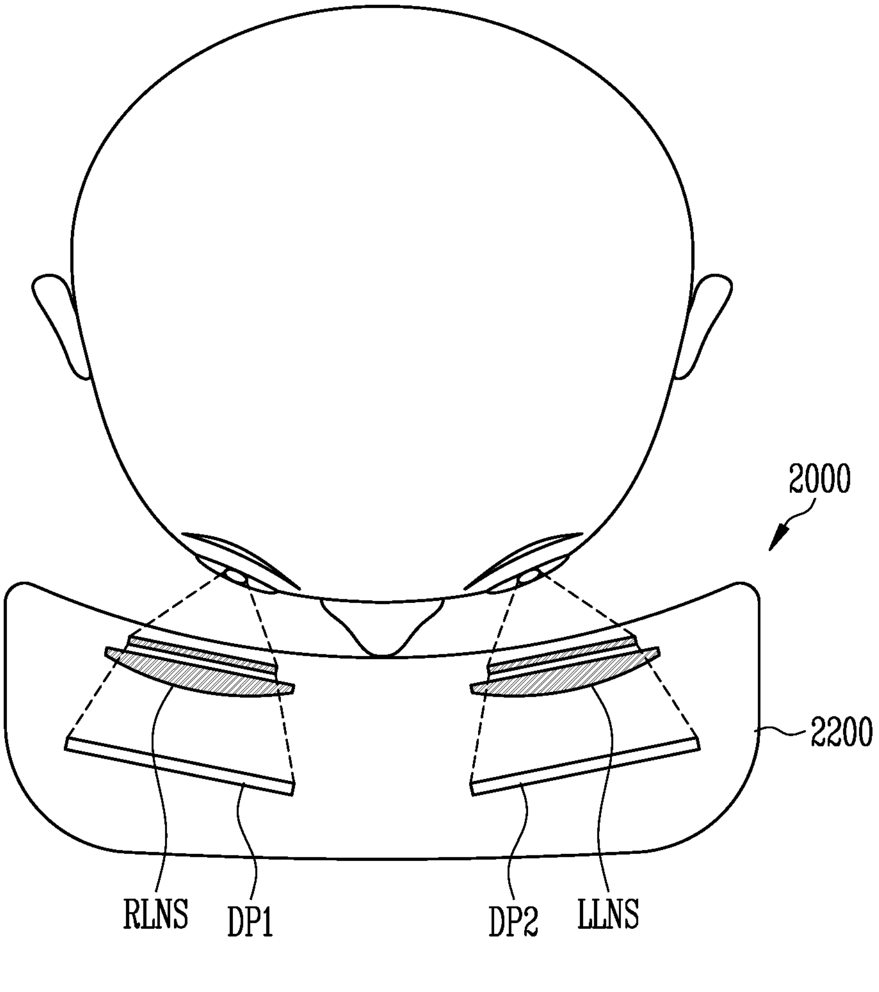
FIG. 16 illustrates a schematic diagram illustrating a head-mounted display device worn by a user of FIG. 15.

FIG. 16 illustrates a schematic diagram illustrating a head-mounted display device worn by a user of FIG. 15.

Referring to FIG. 16, a first display panel DP1 of the first display device 1210 (e.g., refer to FIG. 14) and a second display panel DP2 of the second display device 1220 (e.g., refer to FIG. 14) may be disposed in the head mounted display device 2000. The head-mounted display device 2000 may further include one or more lenses LLNS and RLNS.

In the display device accommodation case 2200, the right eye lens RLNS may be disposed between the first display panel DP1 and the right eye of the user. In the display device accommodation case 2200, the left eye lens LLNS may be disposed between the second display panel DP2 and the left eye of the user.

An image outputted from the first display panel DP1 may be shown to the right eye of the user through the right eye lens RLNS. The right eye lens RLNS may refract light from the first display panel DP1 to be directed to the right eye of the user. The right eye lens RLNS may adjust the viewing distance between the first display panel DP1 and the right eye of the user.

An image outputted from the second display panel DP2 may be shown to the left eye of the user through the left eye lens LLNS. The left eye lens LLNS may refract light from the second display panel DP2 to be directed to the left eye of the user. The left eye lens LLNS may adjust the viewing distance between the second display panel DP2 and the left eye of the user.

In embodiments, each of the right eye lens RLNS and the left eye lens LLNS may include an optical lens having a cross-section of a pancake shape. In the embodiments, each of the right eye lens RLNS and the left eye lens LLNS may include a multi-channel lens including sub-areas with different optical characteristics from each other. Each display panel may output images corresponding to the sub-areas of the multi-channel lens, and the output images may pass through the sub-areas and be viewed by the user.

Figure 17:
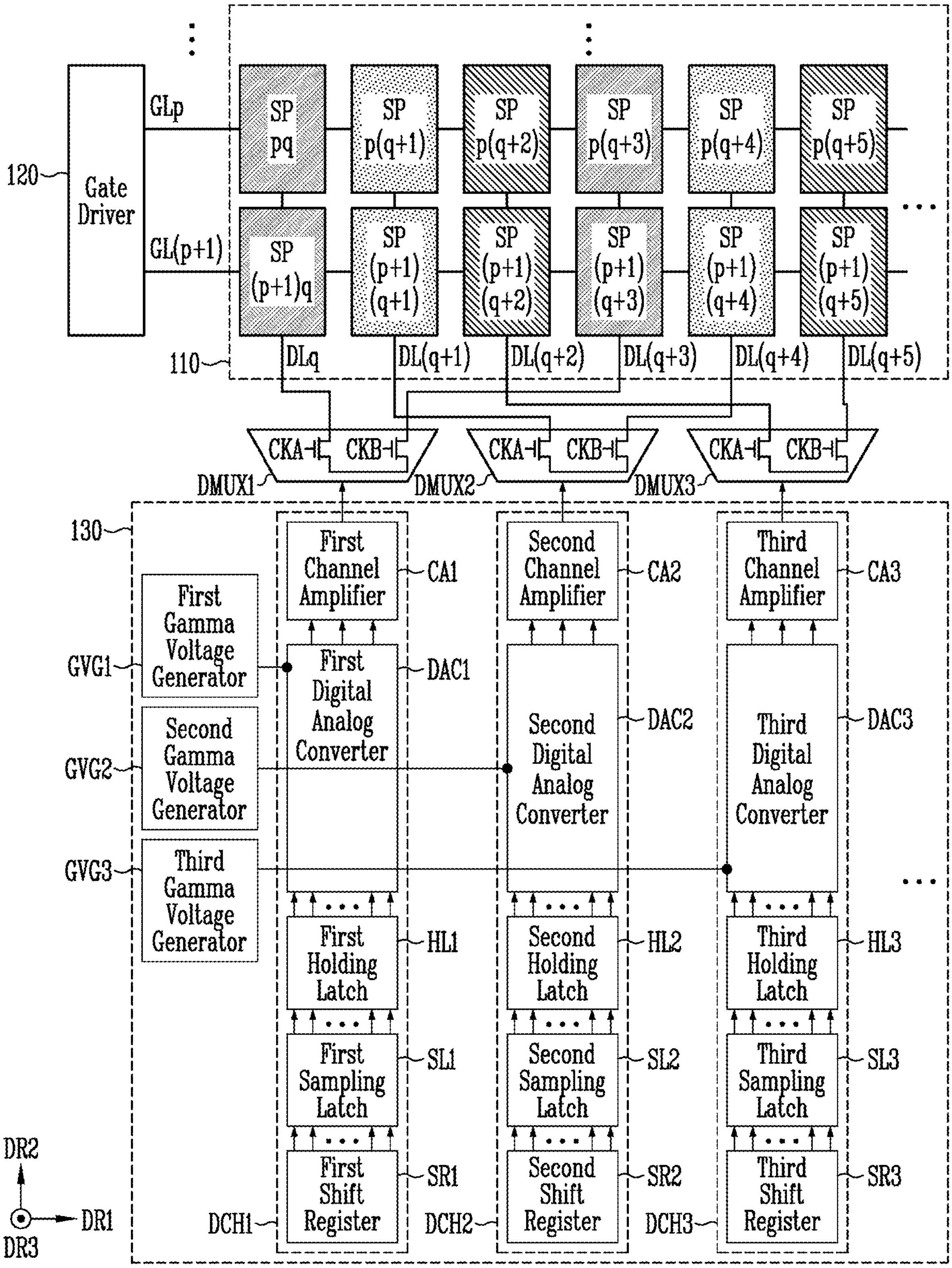
FIG. 17 is a schematic drawing for explaining a data driver according to an embodiment of the disclosure.

FIG. 17 is a schematic drawing for explaining a data driver according to an embodiment of the disclosure.

Referring to FIG. 17, a portion of the display device 100 of FIG. 1 is illustrated. The display device 100 may include the display panel 110, the gate driver 120, the data driver 130, and demultiplexers DMUX1, DMUX2, DMUX3, or the like.

The data driver 130 may supply a first gamma voltage to a first sub-pixel based on a first color grayscale, supply a second gamma voltage to a second sub-pixel based on a second color grayscale, and supply a third gamma voltage to a third sub-pixel based on a third color grayscale. For example, the data driver 130 may supply first gamma voltages of first color grayscales to first sub-pixels, supply second gamma voltages of second color grayscales to second sub-pixels, and supply third gamma voltages of third color grayscales to third sub-pixels.

The data driver 130 may include data channels DCH1, DCH2, and DCH3 and gamma voltage generators GVG1, GVG2, and GVG3. The first gamma voltage generator GVG1 may generate first gamma voltages. For example, the first gamma voltage generator GVG1 may generate respective first gamma voltages of (e.g., corresponding to) respective first color grayscales based on a gamma value (e.g., a set or selectable gamma value) and a display brightness value. For example, the second gamma voltage generator GVG2 may generate respective second gamma voltages of (e.g., corresponding to) respective second color grayscales based on the gamma value and the display brightness value. The third gamma voltage generator GVG3 may generate respective third gamma voltages of (e.g., corresponding to) respective third color grayscales based on the gamma value and the display brightness value.

The first data channel DCH1 may supply the first gamma voltage to the first demultiplexer DMUX1. The first data channel DCH1 may include a first shift register SR1, a first sampling latch SL1, a first holding latch HL1, a first digital-to-analog converter DAC1, and a first channel amplifier CA1.

The first shift register SR1 may receive a source start pulse and a source shift clock from the controller 150 (e.g., refer to FIG. 1). The first shift register SR1 may sequentially generate sampling signals while shifting the source start pulse for each cycle of the source shift clock. For example, the number of generated sampling signals may be equal to the number of bits configuring (e.g., forming) the first color grayscale. For example, the first color grayscale may be composed of 8 bits to express 256 grayscales.

The first sampling latch SL1 may sequentially receive the bits configuring (e.g., forming) the first color grayscale from the controller 150. The first sampling latch SL1 may store bits sequentially provided from the controller 150 in response to the sampling signals sequentially supplied from the first shift register SR1. In case that a source output enable signal is input to the first holding latch HL1 from the controller 150, the first holding latch HL1 may collectively store bits stored in the first sampling latch SL1. The type, number, and configuration of the latches may vary depending on the type of the data driver 130.

The first digital-to-analog converter DAC1 may convert bits configuring (e.g., forming) the first color grayscale, which is a digital value, into the first gamma voltage, which is an analog voltage. The first digital-to-analog converter DAC1 may receive the required first gamma voltage from the first gamma voltage generator GVG1. The first channel amplifier CA1 may include (or be) a buffer. For example, the first channel amplifier CA1 may form (e.g., be configured as) a buffer with a gain of 1.

The second data channel DCH2 may supply the second gamma voltage to the second demultiplexer DMUX2. The second data channel DCH2 may include a second shift register SR2, a second sampling latch SL2, a second holding latch HL2, a second digital-to-analog converter DAC2, and a second channel amplifier CA2. The configuration of the second data channel DCH2 is substantially the same as or similar to that of the first data channel DCH1. Thus, detailed description of the same or similar constituent elements is omitted.

The third data channel DCH3 may supply the third gamma voltage to the third demultiplexer DMUX3. The third data channel DCH3 may include a third shift register SR3, a third sampling latch SL3, a third holding latch HL3, a third digital-to-analog converter DAC3, and a third channel amplifier CA3. The configuration of the third data channel DCH3 is substantially the same as or similar to that of the first data channel DCH1. Thus, detailed description of the same or similar constituent elements is omitted.

The first demultiplexer DMUX1 may transmit the first gamma voltage to the q-th data line DLq or the (q+3)-th data line DL(q+3) based on the control signal. For example, in case that a first control signal CKA is received, the first demultiplexer DMUX1 may transmit the first gamma voltage to the q-th data line DLq. In case that a second control signal CKB is received, the first demultiplexer DMUX1 may transmit the first gamma voltage to the (q+3)-th data line DL(q+3).

The second demultiplexer DMUX2 may transmit the second gamma voltage to the (q+1)-th data line DL(q+1) or the (q+4)-th data line DL(q+4) based on the control signal. For example, in case that the first control signal CKA is received, the second demultiplexer DMUX2 may transmit the second gamma voltage to the (q+1)-th data line DL(q+1). In case that the second control signal CKB is received, the second demultiplexer DMUX2 may transmit the second gamma voltage to the (q+4)-th data line DL(q+4).

The third demultiplexer DMUX3 may transmit the third gamma voltage to the (q+2)-th data line DL(q+2) or the (q+5)-th data line DL(q+5) based on the control signal. For example, in case that the first control signal CKA is received, the third demultiplexer DMUX3 may transmit the third gamma voltage to the (q+2)-th data line DL(q+2). In case that the second control signal CKB is received, the third demultiplexer DMUX3 may transmit the third gamma voltage to the (q+5)-th data line DL(q+5).

The display panel 110 may include sub-pixels SPpq to SP(p+1)(q+5). For example, the sub-pixels SPpq, SPp(q+1), SPp(q+2), SPp(q+3), SPp(q+4), and SPp(q+5) may be electrically connected to the p-th gate line GLp, and the sub-pixels SP(p+1)q, SP(p+1)(q+1), SP(p+1)(q+2), SP(p+1)(q+3), SP(p+1)(q+4), and SP(p+1)(q+5) may be electrically connected to the (p+1)-th gate line GL(p+1).

The first sub-pixels SPpq, SP(p+1)q, SPp(q+3), and SP(p+1)(q+3) may emit light in the first color. The first sub-pixels SPpq and SP(p+1)q may receive the first gamma voltages (or first data signals) from the q-th data line DLq. The first sub-pixels SPp(q+3) and SP(p+1)(q+3) may receive the first gamma voltages (or first data signals) from the (q+3)-th data line DL(q+3).

The second sub-pixels SPp(q+1), SP(p+1)(q+1), SPp(q+4), and SP(p+1)(q+4) may emit light in the second color. The second sub-pixels SPp(q+1) and SP(p+1)(q+1) may receive the second gamma voltages (or second data signals) from the (q+1)-th data line DL(q+1). The second sub-pixels SPp(q+4) and SP(p+1)(q+4) may receive the second gamma voltages (or second data signals) from the (q+4)-th data line DL(q+4).

The third sub-pixels SPp(q+2), SP(p+1)(q+2), SPp(q+5), and SP(p+1)(q+5) may emit light in the third color. The third sub-pixels SPp(q+2) and SP(p+1)(q+2) may receive the third gamma voltages (or third data signals) from the (q+2)-th data line DL(q+2). The third sub-pixels SPp(q+5) and SP(p+1)(q+5) may receive the third gamma voltages (or third data signals) from the (q+5)-th data line DL(q+5).

In FIG. 17, the sub-pixels SPpq, SPp(q+1), SPp(q+2), SPp(q+3), SPp(q+4), SPp(q+5), SP(p+1)q, SP(p+1)(q+1), SP(p+1)(q+2), SP(p+1)(q+3), SP(p+1)(q+4), and SP(p+1)(q+5) of the display panel 110 may be arranged in an RGB stripe method. However, the disclosure is not limited thereto, and the sub-pixels of the display panel 110 may be arranged in other various arrangement methods. For example, the sub-pixels of the display panel 110 may be arranged in various shapes such as diamond PENTILE™, S-stripe, real RGB, and normal PENTILE™.

Figure 18:
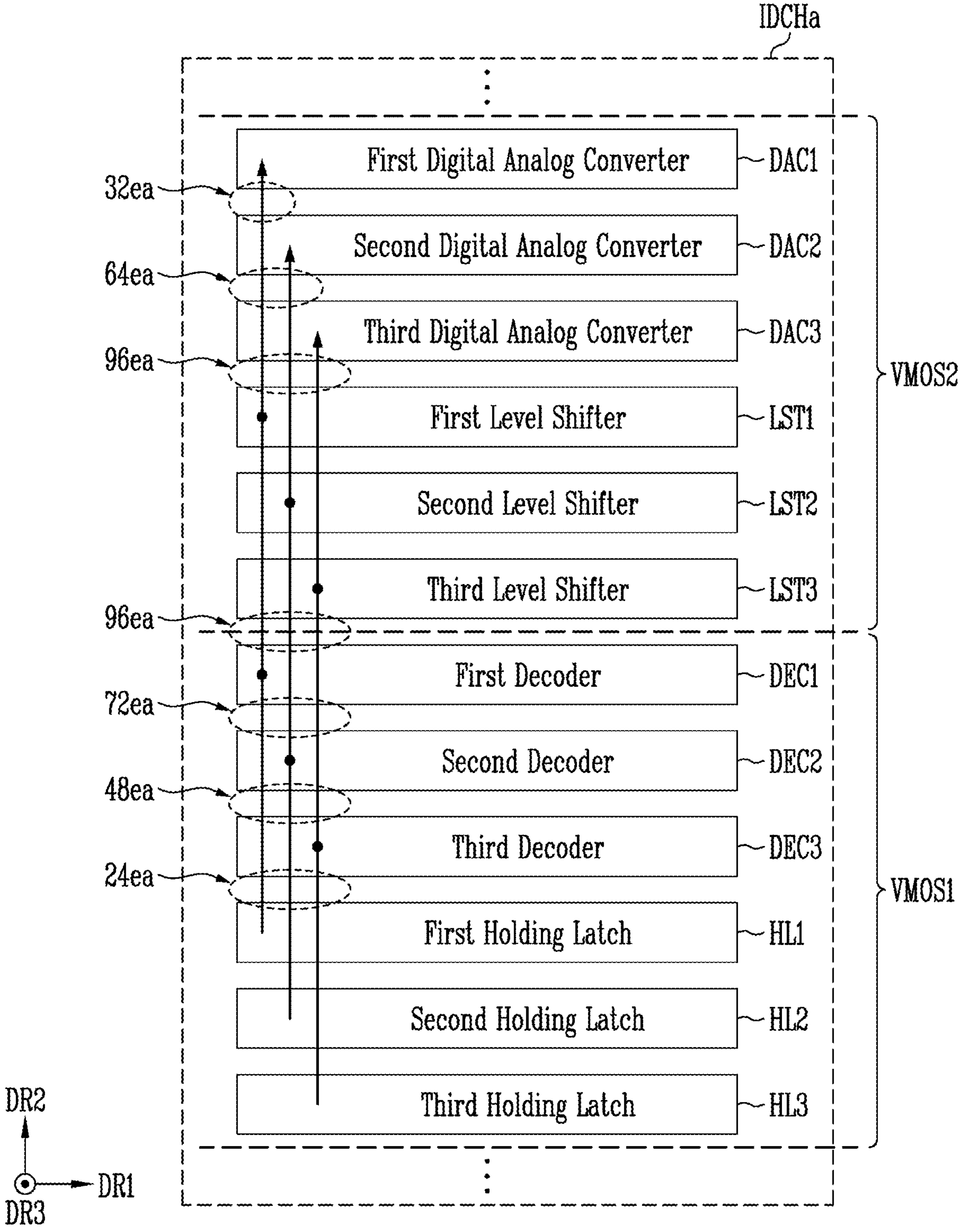
FIG. 18 is a schematic drawing for explaining a data driver according to an embodiment of the disclosure.

FIG. 18 is a schematic drawing for explaining a data driver according to an embodiment of the disclosure.

Referring to FIG. 18, a data channel IDCHa may include a first data channel DCH1 (e.g., refer to FIG. 17), a second data channel DCH2 (e.g., refer to FIG. 17), and a third data channel DCH3 (e.g., refer to FIG. 17). In case that the sub-pixels of the display panel 110 become higher in resolution, the length in the first direction DR1 of the data channel may be decreased. Therefore, according to the embodiment, the data channel IDCHa may include the first data channel DCH1, the second data channel DCH2, and the third data channel DCH3 arranged along the second direction DR2. Thus, the length of the data channel in the first direction DR1 may be reduced.

The data channel IDCHa may include first to third holding latches HL1, HL2, and HL3, first to third decoders DEC1, DEC2, and DEC3, first to third level shifters LST1, LST2, and LST3, and first to third digital-to-analog converters DAC1, DAC2, and DAC3. For example, the first to third holding latches HL1, HL2, and HL3 may be holding latches. However, in some embodiments, the first to third holding latches HL1, HL2, and HL3 may be sampling latches, latches (e.g., integrated latches) in which sampling latches and holding latches are integrated, or other various latches.

The first latch HL1 may provide a first color grayscale in a first voltage range. The first decoder DEC1 may generate a first gate control signal in the first voltage range based on the first color grayscale in the first voltage range.

The first level shifter LST1 may convert the first gate control signal in the first voltage range into a first gate control signal in a second voltage range greater than the first voltage range. In the embodiment, the maximum value of the second voltage range may be higher than the maximum value of the first voltage range. In another embodiment, the minimum value of the second voltage range may be lower than the minimum value of the first voltage range. In another embodiment, the difference between the maximum value and the minimum value in the second voltage range may be greater than the difference between the maximum value and the minimum value in the first voltage range.

The first digital-to-analog converter DAC1 may provide a first gamma voltage of (e.g., corresponding to) the first color grayscale based on the first gate control signal in the second voltage range. The first gamma voltage may be an analog voltage and have a value greater than the voltage of digital signals. Accordingly, large-area second transistors VMOS2 may be used to provide the first gamma voltage. Each of the large-area second transistors VMOS2 may include a middle voltage MOSFET (MVMOS), a high voltage MOSFET (HVMOS), or the like. To use the second transistors VMOS2, the first gate control signal for controlling the second transistors VMOS2 should have a second voltage range greater than the first voltage range.

The area of each of the first transistors VMOS1 of (e.g., included in) the first latch HL1 and the first decoder DEC1 may be smaller than the area of each of the second transistors VMOS2 of (e.g., included in) the first level shifter LST1 and the first digital-to-analog converter DAC1. In the data channel IDCHa, the first latch HL1 and the first decoder DEC1 may be disposed in front of the first level shifter LST1. Accordingly, the first latch HL1 and the first decoder DEC1 may include first transistors VMOS1 having a relatively small area such as a low voltage MOSFET (LVMOS). Hereinafter, detailed description of the same or similar constituent elements is omitted.

The second holding latch HL2 may provide a second color grayscale in the first voltage range. The second decoder DEC2 may generate a second gate control signal in the first voltage range based on the second color grayscale in the first voltage range.

The second level shifter LST2 may convert the second gate control signal in the first voltage range into the second gate control signal in the second voltage range. The second digital-to-analog converter DAC2 may provide a second gamma voltage of (e.g., corresponding to) the second color grayscale based on the second gate control signal in the second voltage range.

The area of each of the first transistors VMOS1 of (e.g., included in) the second holding latch HL2 and the second decoder DEC2 may be smaller than the area of each of the second transistors VMOS2 of (e.g., included in) the second level shifter LST2 and the second digital-to-analog converter DAC2.

The third latch HL3 may provide a third color grayscale in the first voltage range. The third decoder DEC3 may generate a third gate control signal in the first voltage range based on the third color grayscale in the first voltage range.

The third level shifter LST3 may convert the third gate control signal in the first voltage range into the third gate control signal in the second voltage range. The third digital-to-analog converter DAC3 may provide a third gamma voltage of (e.g., corresponding to) the third color grayscale based on the third gate control signal in the second voltage range.

The area of each of the first transistors VMOS1 of (e.g., included in) the third latch HL3 and the third decoder DEC3 may be smaller than the area of each of the second transistors VMOS2 of (e.g., included in) the third level shifter LST3 and the third digital-to-analog converter DAC3.

In the embodiment of FIG. 18, the first to third decoders DEC1, DEC2, and DEC3 may be disposed between the first to third holding latches HL1, HL2, and HL3, and the first to third level shifters LST1, LST2, and LST3.

The first decoder DEC1 may receive the first color grayscale through N wires and output the first gate control signal through M wires. N may be an integer greater than 0, and M may be an integer greater than N. For example, the second decoder DEC2 may receive the second color grayscale through N wires and output the second gate control signal through M wires. The third decoder DEC3 may receive the third color grayscale through N wires and output the third gate control signal through M wires. For example, each color grayscale may consist of 8 bits, and four gate control signals may be required for each bit (e.g., each bit of the color grayscale). For example, N may be 8, and M may be 32.

24 wires may be extended after the first latch HL1, 48 wires may be extended after the third decoder DEC3, 72 wires may be extended after the second decoder DEC2, and 96 wires may be extended after the first decoder DEC1. For example, the 24 wires may be electrically connected to the first latch HL1, the 48 wires may be electrically connected to the third decoder DEC3, the 72 wires may be electrically connected to the second decoder DEC2, and the 96 wires may be electrically connected to the first decoder DEC1. The densely packed 96 wires may extend to adjacent one of the first level shifter LST1, and a space for these wires may be required.

Figure 19:
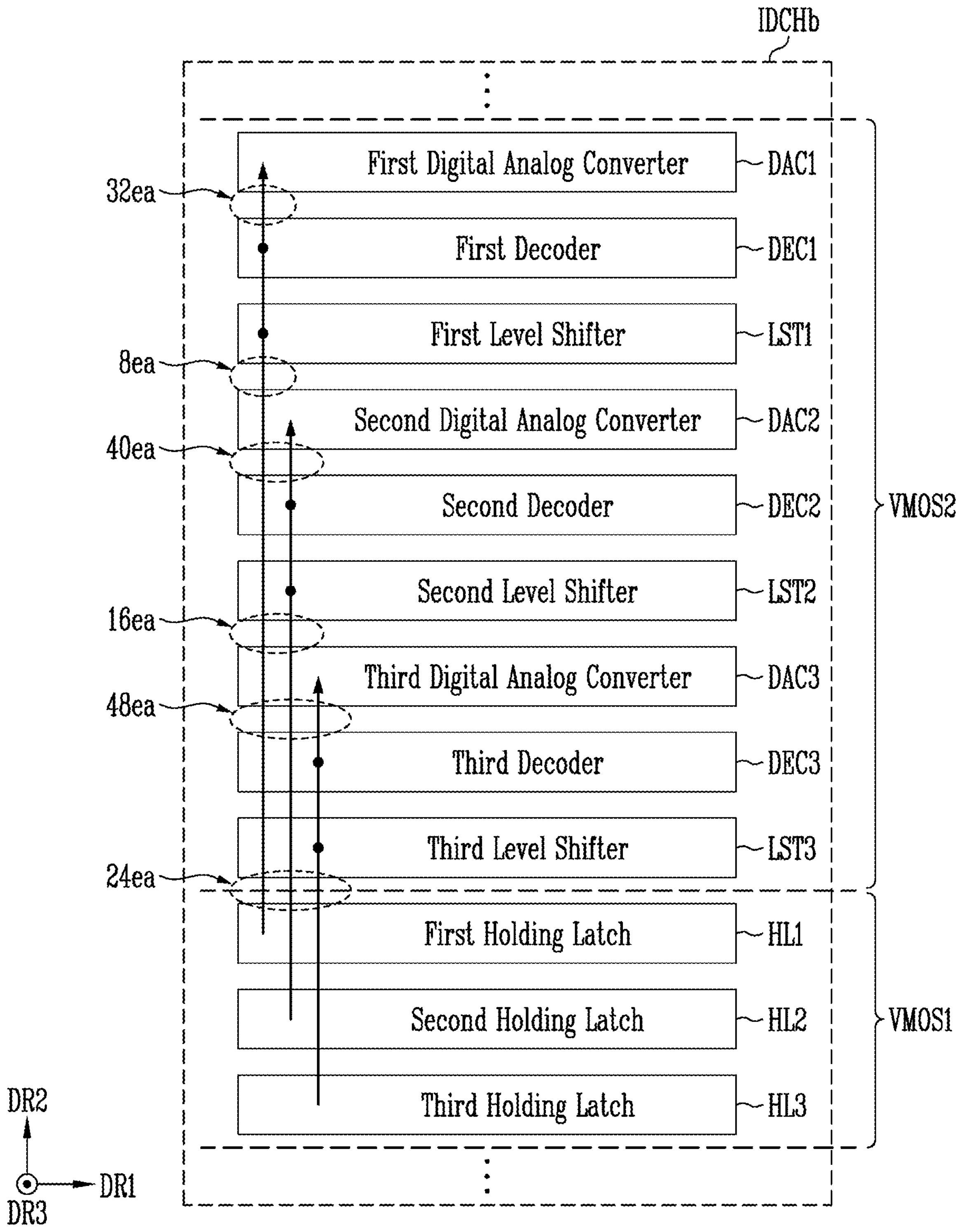
FIG. 19 is a schematic drawing for explaining a data driver according to an embodiment of the disclosure.

FIG. 19 is a schematic drawing for explaining a data driver according to an embodiment of the disclosure.

Referring to FIG. 19, a data channel IDCHb may include a first data channel DCH1 (e.g., refer to FIG. 17), a second data channel DCH2 (e.g., refer to FIG. 17), and a third data channel DCH3 (e.g., refer to FIG. 17). In case that the sub-pixels of the display panel 110 become higher in resolution, the length in the first direction DR1 of the data channel may be reduced. Therefore, according to the embodiment, the data channel IDCHb may include the first data channel DCH1, the second data channel DCH2, and the third data channel DCH3 arranged along the second direction DR2. Thus, the length of the data channel in the first direction DR1 may be reduced.

The data channel IDCHb may include first to third holding latches HL1, HL2, and HL3, first to third decoders DEC1, DEC2, and DEC3, first to third level shifters LST1, LST2, and LST3, and first to third digital-to-analog converters DAC1, DAC2, and DAC3. For example, the first to third holding latches HL1, HL2, and HL3 may be holding latches. However, in some embodiments, the first to third holding latches HL1, HL2, and HL3 may be sampling latches, latches (e.g., integrated latches) in which sampling latches and holding latches are integrated, or other various latches.

The first latch HL1 may provide a first color grayscale in a first voltage range. The first level shifter LST1 may convert the first color grayscale in the first voltage range into the first color grayscale in the second voltage range. The first decoder DEC1 may generate a first gate control signal in the second voltage range based on the first color grayscale in the second voltage range. The first digital-to-analog converter DAC1 may provide a first gamma voltage of (e.g., corresponding to) the first color grayscale based on the first gate control signal in the second voltage range.

According to the embodiment, the first latch HL1 may include (e.g., be configured of) first transistors VMOS1 driven in the first voltage range. The first level shifter LST1, the first decoder DEC1, and the first digital-to-analog converter DAC1 may include (e.g., be configured of) second transistors VMOS2 driven in the second voltage range. For example, the area of each of the first transistors VMOS1 of (e.g., included in) the first latch HL1 may be smaller than the area of each of the second transistors VMOS2 of (e.g., included in) the first decoder DEC1, the first level shifter LST1, and the first digital-to-analog converter DAC1.

For example, the second holding latch HL2 may provide a second color grayscale in the first voltage range. The second level shifter LST2 may convert the second color grayscale in the first voltage range into the second color grayscale in the second voltage range. The second decoder DEC2 may generate a second gate control signal in the second voltage range based on the second color gray level in the second voltage range. The second digital-to-analog converter DAC2 may provide a second gamma voltage of (e.g., corresponding to) the second color grayscale based on the second gate control signal in the second voltage range.

The area of each of the first transistors VMOS1 of (e.g., included in) the second holding latch HL2 may be smaller than the area of each of the second transistors VMOS2 of (e.g., included in) the second decoder DEC2, the second level shifter LST2, and the second digital-to-analog converter DAC2.

For example, the third latch HL3 may provide a third color grayscale in the first voltage range. The third level shifter LST3 may convert the third color grayscale in the first voltage range into the third color grayscale in the second voltage range. The third decoder DEC3 may generate a third gate control signal in the second voltage range based on the third color grayscale in the second voltage range. The third digital-to-analog converter DAC3 may provide a second gamma voltage of (e.g., corresponding to) the third color grayscale based on the third gate control signal in the second voltage range.

The area of each of the first transistors VMOS1 of (e.g., included in) the third latch HL3 may be smaller than the area of each of the second transistors VMOS2 of (e.g., included in) the third decoder DEC3, the third level shifter LST3, and the third digital-to-analog converter DAC3.

The data channel IDCHb differs from the data channel IDCHa in that the decoder for each color grayscale is disposed on an adjacent stage of the corresponding level shifter. For example, the first decoder DEC1 may be disposed on the adjacent stage of the first level shifter LST1. For example, the second decoder DEC2 may be disposed on the adjacent stage of the second level shifter LST2. The third decoder DEC3 may be disposed on the adjacent stage of the third level shifter LST3.

The second level shifter LST2, the second decoder DEC2, and the second digital-to-analog converter DAC2 may be disposed between the first latch HL1 and the first level shifter LST1. For example, the third level shifter LST3, the third decoder DEC3, and the third digital-to-analog converter DAC3 may be disposed between the first latch HL1 and the first level shifter LST1. In some embodiments, the second level shifter LST2, the second decoder DEC2, and the second digital-to-analog converter DAC2 may be disposed between the third digital-to-analog converter DAC3 and the first level shifter LST1.

The first decoder DEC1 may receive the first color grayscale through N wires and output the first gate control signal through M wires. N may be an integer greater than 0, and M may be an integer greater than N. For example, the second decoder DEC2 may receive the second color grayscale through N wires and output the second gate control signal through M wires. The third decoder DEC3 may receive the third color grayscale through N wires and output the third gate control signal through M wires. For example, each color grayscale may consist of 8 bits, and four gate control signals may be required for each bit (e.g., each bit of the color grayscale). For example, N may be 8, and M may be 32.

24 wires may be extended after the first latch HL1, and 48 wires may be extended after the third decoder DEC3. For example, the 24 wires may be electrically connected to the first latch HL1, and the 48 wires may be electrically connected to the third decoder DEC3. However, since 16 wires is extended after the third digital-to-analog converter DAC3, the number of wires may be significantly reduced (e.g., the number of wires electrically connected from the third digital-to-analog converter DAC3 to the demultiplexer DMUX3 or data line is excluded).

40 wires may be extended after the second decoder DEC2, and 8 wires may be extended after the second digital-to-analog converter DAC2. For example, the 40 wires may be electrically connected to the second decoder DEC2, and the 8 wires may be electrically connected to the second-to-digital analog converter DAC2. 32 wires are extended after the first decoder DEC1. For example, the 32 wires may be electrically connected to the first decoder DEC1.

According to the embodiment, compared to FIG. 18, the wiring density may be reduced, and space for wiring may be readily secured.

Although, according to the embodiment, the first to third decoders DEC1, DEC2, and DEC3 may include (e.g., be configured of) relatively large-area second transistors VMOS2. Since the number of the large-area second transistors VMOS2 included in the first to third decoders DEC1, DEC2, and DEC3 is relatively small, the space for wiring may be reduced. Since the area increase due to transistors (e.g., the large-area second transistors VMOS2) is smaller than the area increase due to wiring, the area for forming the data channel IDCHb may be smaller than the area for forming the data channel IDCHa.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A data driver comprising:
- a first latch that provides a first color grayscale in a first voltage range;
- a first level shifter that converts the first color grayscale in the first voltage range into a first color grayscale in a second voltage range greater than the first voltage range;
- a first decoder that generates a first gate control signal in the second voltage range based on the first color grayscale in the second voltage range; and
- a first digital-to-analog converter that provides a first gamma voltage of the first color grayscale based on the first gate control signal in the second voltage range,
- wherein an area of each of first transistors of the first latch is smaller than an area of each of second transistors of the first decoder, the first level shifter, and the first digital-to-analog converter.

2. The data driver of claim 1, wherein
- the first decoder receives the first color grayscale through N wires, and outputs the first gate control signal through M wires,
- N is an integer greater than 0, and
- M is an integer greater than N.

3. The data driver of claim 1, further comprising:
- a second latch that provides a second color grayscale in the first voltage range;
- a second level shifter that converts the second color grayscale in the first voltage range into the second color grayscale in the second voltage range;
- a second decoder that generates a second gate control signal in the second voltage range based on the second color grayscale in the second voltage range; and
- a second digital-to-analog converter that provides a second gamma voltage of the second color grayscale based on the second gate control signal in the second voltage range.

4. The data driver of claim 3, wherein
- an area of each of first transistors of the second latch is smaller than an area of each of second transistors of the second decoder, the second level shifter, and the second digital-to-analog converter.

5. The data driver of claim 3, wherein
- the second decoder receives the second color grayscale through N wires, and outputs the second gate control signal through M wires,
- N is an integer greater than 0, and
- M is an integer greater than N.

6. The data driver of claim 3, wherein
the second level shifter, the second decoder, and the second digital-to-analog converter are disposed between the first latch and the first level shifter.
7. The data driver of claim 6, further comprising:
a third latch that provides a third color grayscale in the first voltage range;
a third level shifter that converts the third color grayscale in the first voltage range into the third color grayscale in the second voltage range;
a third decoder that generates a third gate control signal in the second voltage range based on the third color grayscale in the second voltage range; and
a third digital-to-analog converter that provides a third gamma voltage of the third color grayscale based on the third gate control signal in the second voltage range.
8. The data driver of claim 7, wherein
an area of each of first transistors of the third latch is smaller than an area of each of second transistors of the third decoder, the third level shifter, and the third digital-to-analog converter.
9. The data driver of claim 7, wherein
the third decoder receives the third color grayscale through N wires, and outputs the third gate control signal through M wires,
N is an integer greater than 0, and
M is an integer greater than N.
10. A display device comprising:
a first sub-pixel emitting light in a first color;
a second sub-pixel emitting light in a second color;
a third sub-pixel emitting light in a third color; and
a data driver that supplies a first gamma voltage to the first sub-pixel based on a first color grayscale, supplies a second gamma voltage to the second sub-pixel based on a second color grayscale, and supplies a third gamma voltage to the third sub-pixel based on a third color grayscale,
wherein the data driver includes:
a first latch that provides the first color grayscale in a first voltage range;
a first level shifter that converts the first color grayscale in the first voltage range into a first color grayscale in a second voltage range greater than the first voltage range;
a first decoder that generates a first gate control signal in the second voltage range based on the first color grayscale in the second voltage range; and
a first digital-to-analog converter that provides the first gamma voltage of the first color grayscale based on the first gate control signal in the second voltage range, and
wherein an area of each of first transistors of the first latch is smaller than an area of each of second transistors of the first decoder, the first level shifter, and the first digital-to-analog converter.
11. The display device of claim 10, wherein
the first decoder receives the first color grayscale through N wires, and outputs the first gate control signal through M wires,
N is an integer greater than 0, and
M is an integer greater than N.
12. The display device of claim 10, further comprising:
a second latch that provides the second color grayscale in the first voltage range;
a second level shifter that converts the second color grayscale in the first voltage range into the second color grayscale in the second voltage range;
a second decoder that generates a second gate control signal in the second voltage range based on the second color grayscale in the second voltage range; and
a second digital-to-analog converter that provides the second gamma voltage of the second color grayscale based on the second gate control signal in the second voltage range.
13. The display device of claim 12, wherein
an area of each of first transistors of the second latch is smaller than an area of each of second transistors of the second decoder, the second level shifter, and the second digital-to-analog converter.
14. The display device of claim 12, wherein
the second decoder receives the second color grayscale through N wires, and outputs the second gate control signal through M wires,
N is an integer greater than 0, and
M is an integer greater than N.
15. The display device of claim 12, wherein
the second level shifter, the second decoder, and the second digital-to-analog converter are disposed between the first latch and the first level shifter.
16. The display device of claim 15, further comprising:
a third latch that provides the third color grayscale in the first voltage range;
a third level shifter that converts the third color grayscale in the first voltage range into the third color grayscale in the second voltage range;
a third decoder that generates a third gate control signal in the second voltage range based on the third color grayscale in the second voltage range; and
a third digital-to-analog converter that provides the third gamma voltage of the third color grayscale based on the third gate control signal in the second voltage range.
17. The display device of claim 16, wherein
an area of each of first transistors of the third latch is smaller than an area of each of second transistors of the third decoder, the third level shifter, and the third digital-to-analog converter.
18. An electronic device comprising:
a processor that provides image data; and
a display device that displays an image based on the image data,
wherein the display device includes:
a first sub-pixel emitting light in a first color;
a second sub-pixel emitting light in a second color;
a third sub-pixel emitting light in a third color; and
a data driver that supplies a first gamma voltage to the first sub-pixel based on a first color grayscale, supplies a second gamma voltage to the second sub-pixel based on a second color grayscale, and supplies a third gamma voltage to the third sub-pixel based on a third color grayscale,
wherein the data driver includes:
a first latch that provides the first color grayscale in a first voltage range;
a first level shifter that converts the first color grayscale in the first voltage range into a first color grayscale in a second voltage range greater than the first voltage range;
a first decoder that generates a first gate control signal in the second voltage range based on the first color grayscale in the second voltage range; and
a first digital-to-analog converter that provides the first gamma voltage of the first color grayscale based on the first gate control signal in the second voltage range, and wherein an area of each of first transistors of the first latch is smaller than an area of each of second transistors of the first decoder, the first level shifter, and the first digital-to-analog converter.

* * * * *